United States Patent
Massenburg

(10) Patent No.: US 8,510,361 B2
(45) Date of Patent: Aug. 13, 2013

(54) VARIABLE EXPONENT AVERAGING DETECTOR AND DYNAMIC RANGE CONTROLLER

(76) Inventor: George Massenburg, Franklin, TN (US)

(*) Notice: Subject to any disclaimer, the term of this patent is extended or adjusted under 35 U.S.C. 154(b) by 540 days.

(21) Appl. No.: 12/790,483

(22) Filed: May 28, 2010

(65) Prior Publication Data

US 2011/0295919 A1    Dec. 1, 2011

(51) Int. Cl.
*G06F 17/10*    (2006.01)
(52) U.S. Cl.
USPC .......................................................... 708/300
(58) Field of Classification Search
None
See application file for complete search history.

(56) References Cited

U.S. PATENT DOCUMENTS

| | | | | |
|---|---|---|---|---|
| 3,696,400 A | * | 10/1972 | Lang | 341/159 |
| 5,726,924 A | * | 3/1998 | Buss et al. | 708/277 |
| 5,951,628 A | * | 9/1999 | Pan et al. | 708/420 |
| 6,552,591 B1 | * | 4/2003 | Abadi et al. | 327/306 |
| 7,774,396 B2 | * | 8/2010 | Dickson et al. | 708/322 |
| 2002/0160733 A1 | * | 10/2002 | Kajita | 455/234.1 |
| 2009/0161889 A1 | * | 6/2009 | Magrath | 381/107 |
| 2010/0198378 A1 | * | 8/2010 | Smithers et al. | 700/94 |
| 2010/0198899 A1 | * | 8/2010 | Dickson et al. | 708/322 |
| 2011/0009987 A1 | * | 1/2011 | Seefeldt et al. | 700/94 |

OTHER PUBLICATIONS

International Search Report in PCT/US2011/036566, the PCT counterpart application of U.S. Appl. No. 12/790,483. This IDS is submitted prior to examination on the merits.

* cited by examiner

*Primary Examiner* — David H Malzahn
(74) *Attorney, Agent, or Firm* — Laurence J. Shaw

(57) ABSTRACT

The VEA Detector and Dynamic Range Controller of the invention more accurately measure constant or non-constant, periodic or aperiodic, signals and the use of such measurements to control the upstream and/or downstream processing of program signals, including without limitation audio, video, and power program signals. The invention uses an antilog module acting within the context of a log domain circuit such that the "averaging" at an integrator is linear, not logarithmic. However, since the detection is within the log domain, the dynamic range of the VEA Detector is exponentially larger.

19 Claims, 28 Drawing Sheets

Input Signal Preparation and Log Converter

VEA Detector with simple Release
(in Log Domain)

VEA Detector with Corrected Static Release
(in Log Domain)

VEA/ Average Switchable Fast Detector
Switchable between VEA with Corrected Static Release, and Average
(in Log Domain)

Detector
two VEA Detectors, one for Attack and one for Release, with Corrected Static Release Detector 1
2 VEA Detectors, one for Attack and one for Release,
with Corrected Static Release Detector 2
1 VEA Detector with
Corrected Static Release Detector Fast, for Release
1 VEA Detector or 1 Averaging Detector (switchable)

VEA Dynamic Range Controller
Control Processor

VEA Dynamic Range Controller - Gain Control

VEA Dynamic Range Controller
with 3 VEA Detectors + Ratio Control + Knee Generator Knee Generator transfer characteristic

**Figure 15B
Knee Generator
transfer characteristic**

$$KG_W = \left(\frac{512}{\{64,56,48,40,32,24,16,8,1\}}\right)$$
$$\underbrace{\phantom{\frac{512}{\{64,56,48,40,32,24,16,8,1\}}}}_{KGratio}$$

$$KGout = KGin > -\left(\frac{1}{KG_W}\right) ? \left( KGin < \frac{1}{KG_W} ? \frac{\left(\left(\left(\left(64 \cdot \left(\frac{1}{KG_W} + KGin\right) \cdot (KG_W)\right)\right)^2\right) \cdot \left(\frac{1}{KG_W}\right)\right)}{16384} : KGin \right) : 0$$

VEA Dynamic Range Controller
with 3 VEA Detectors + Expander + Ratio Control + Knee Generator

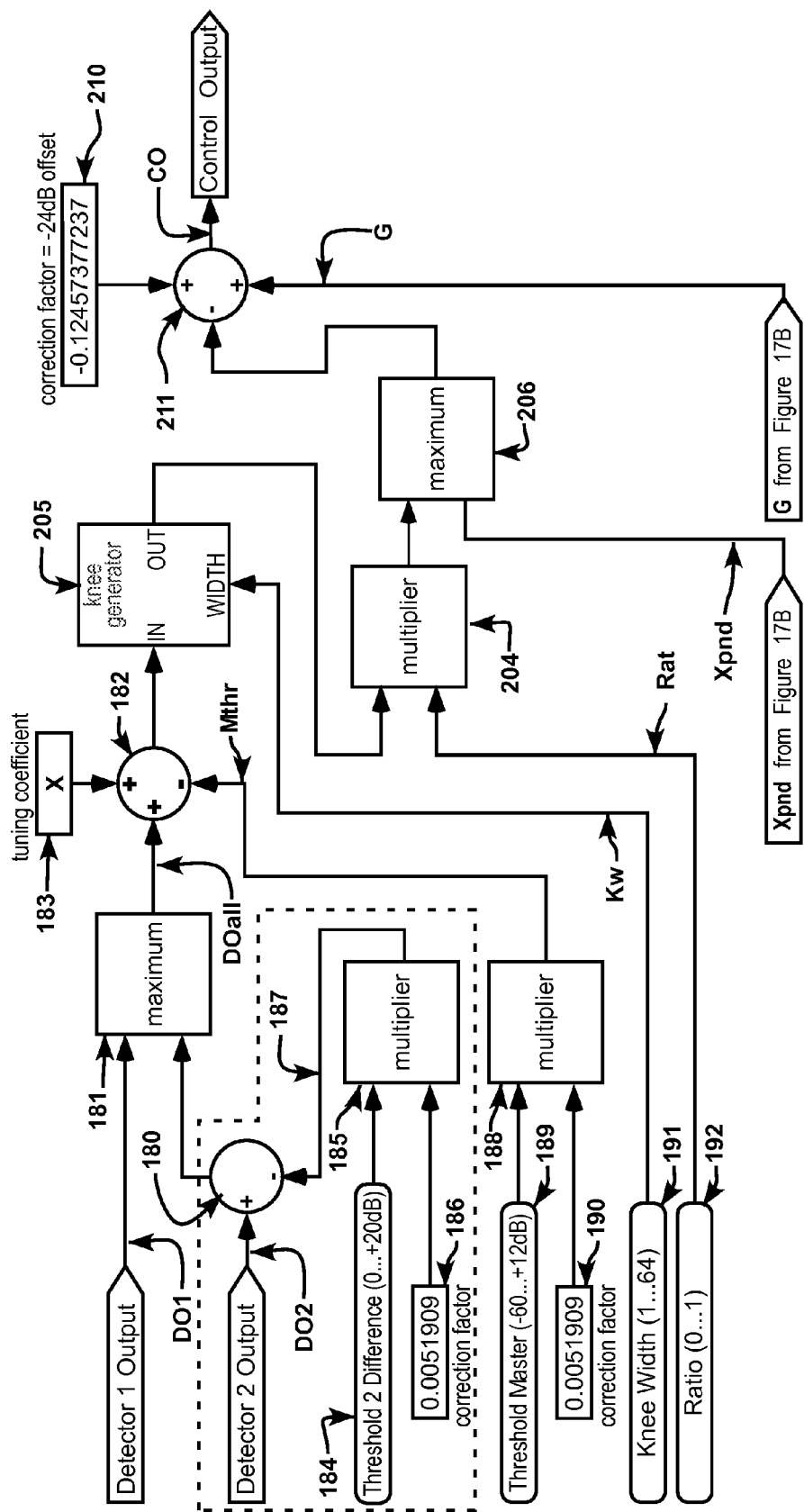

VEA Dynamic Range Controller
Control Processor for 3 VEA Detectors with
Expander + Ratio Control + Knee Generator VEA Dynamic Range Controller
with 1 VEA Detector & Ratio Control VEA Dynamic Range Controller
Control Processor for 1 VEA Detector
with Ratio Control VEA Dynamic Range Controller
with 1 VEA Detector + Ratio Control + Knee Generator

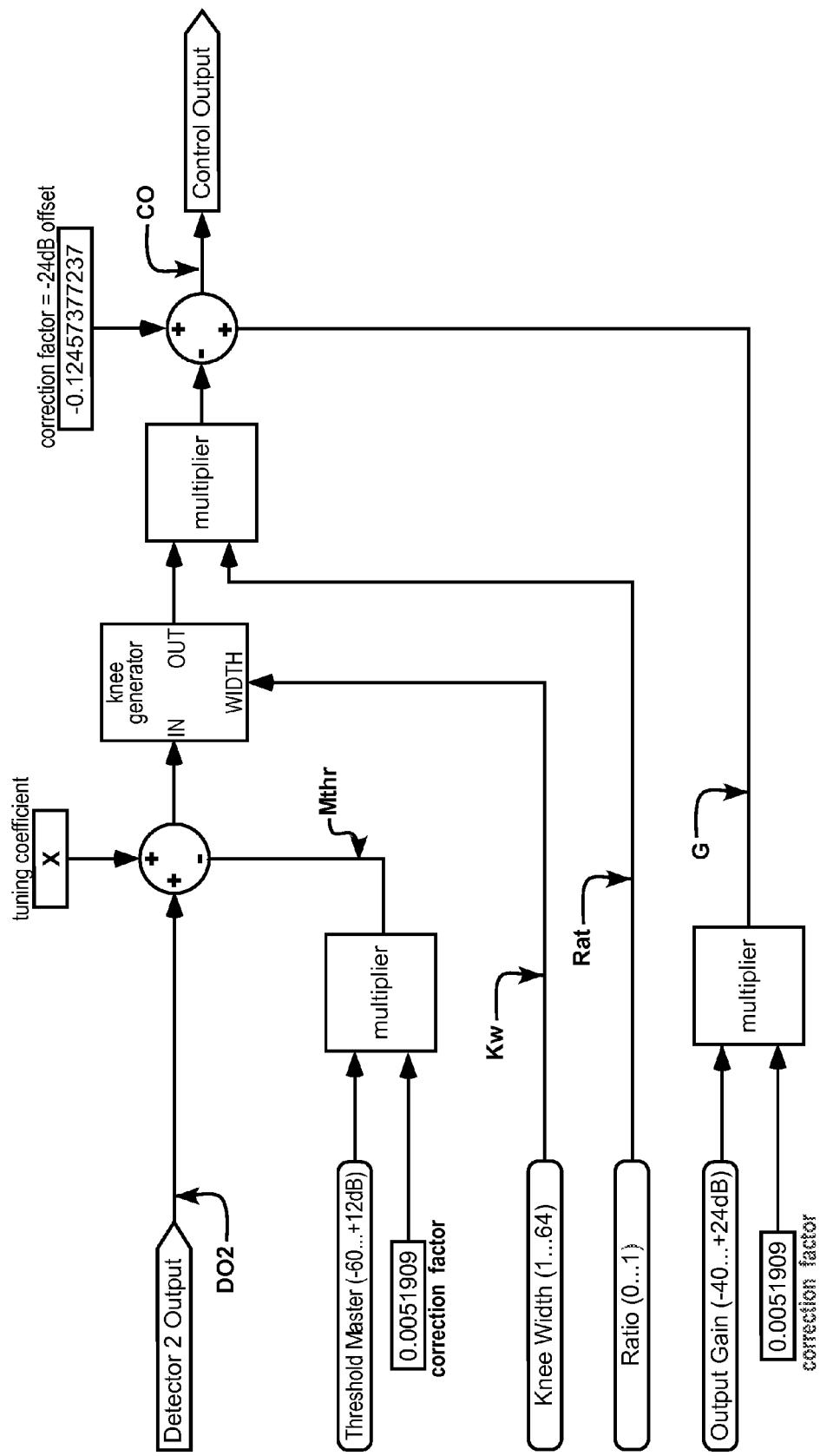

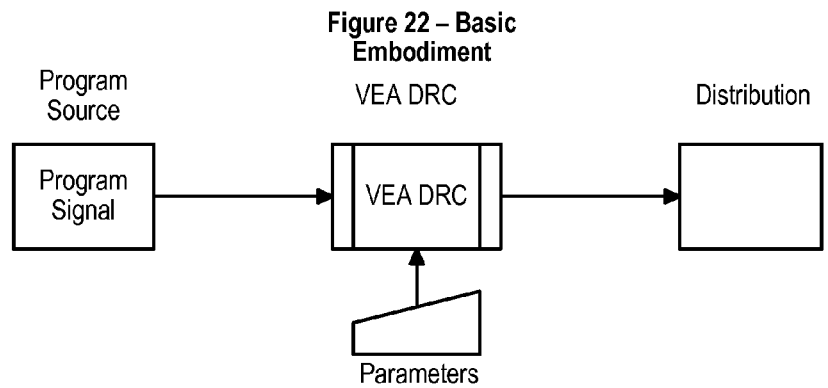
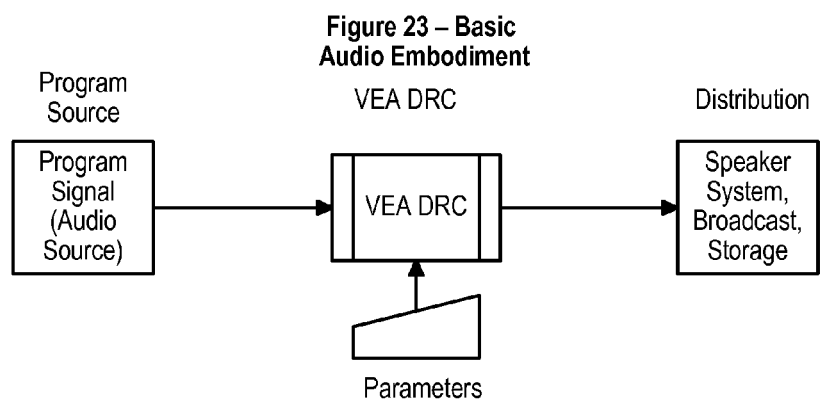
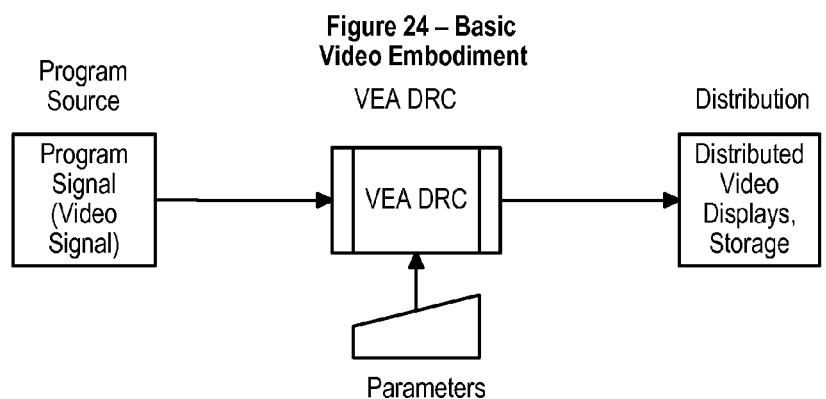
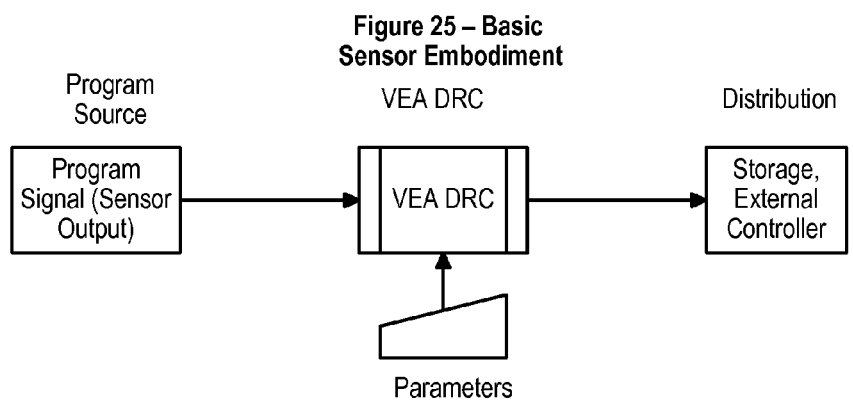

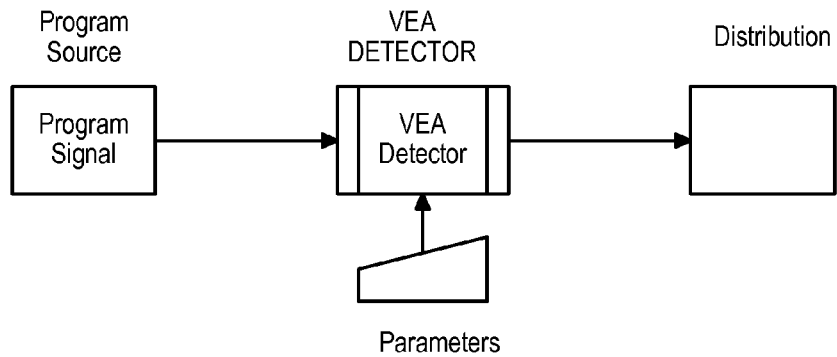
Figure 26 – Basic Measurement Embodiment
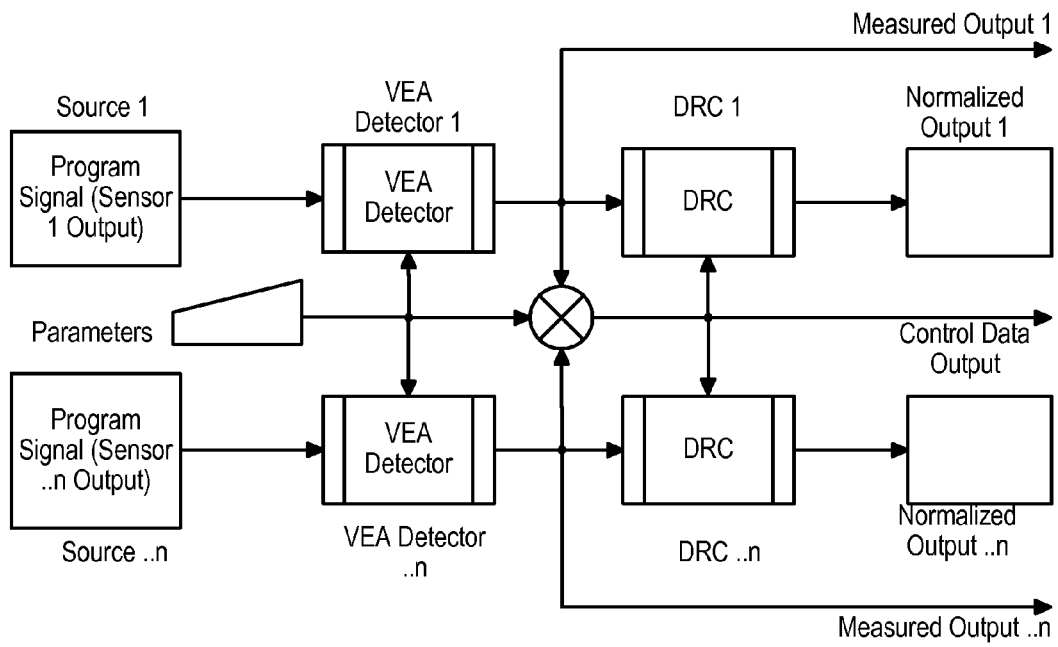
Figure 27 – Measurement Embodiment Comparisons and Matching

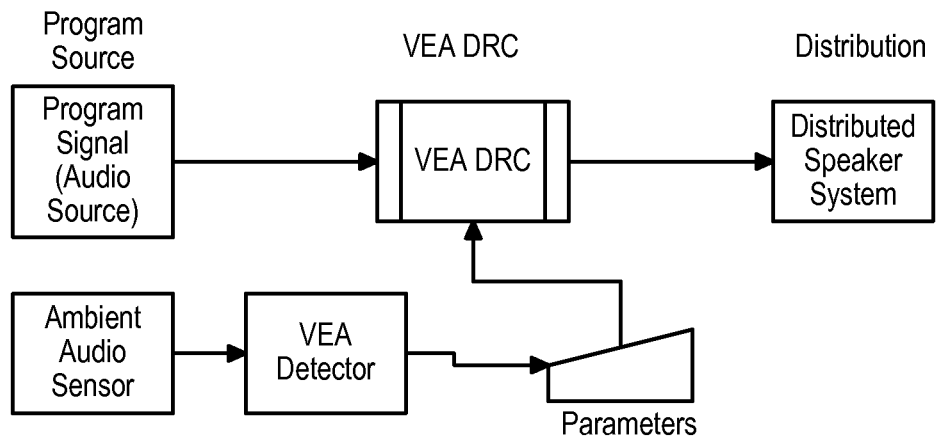
Figure 28 – Ambient Embodiment - Audio
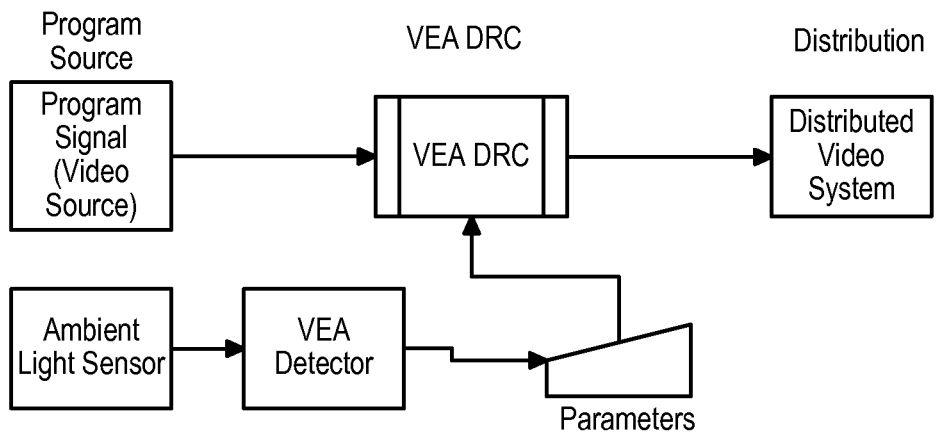
Figure 29 – Ambient Embodiment - Video

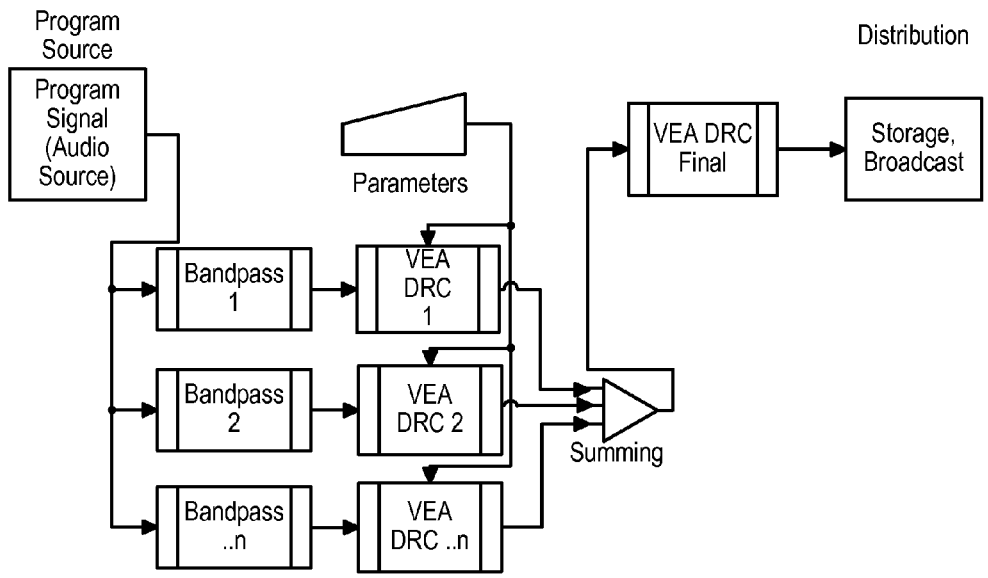
Figure 30 – MultiBand Embodiment - Audio
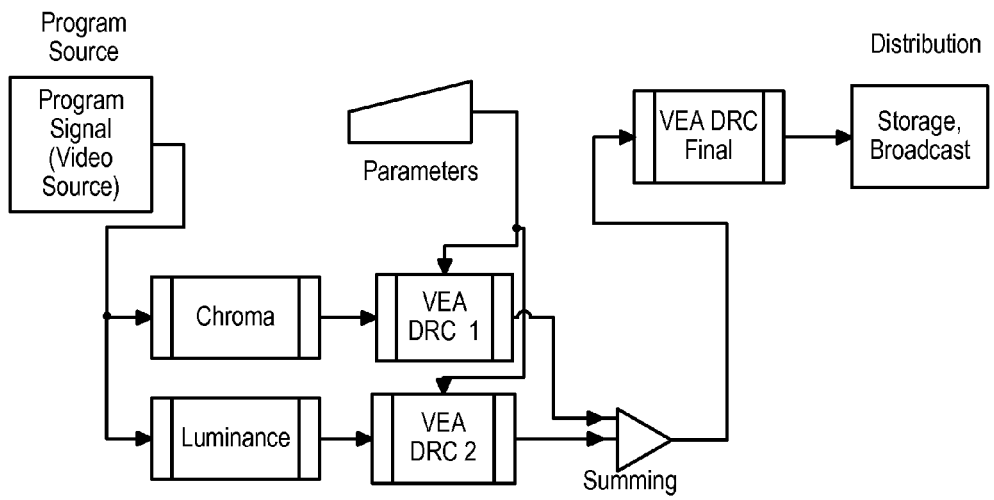
Figure 31 – Multi Thread Embodiment - Video

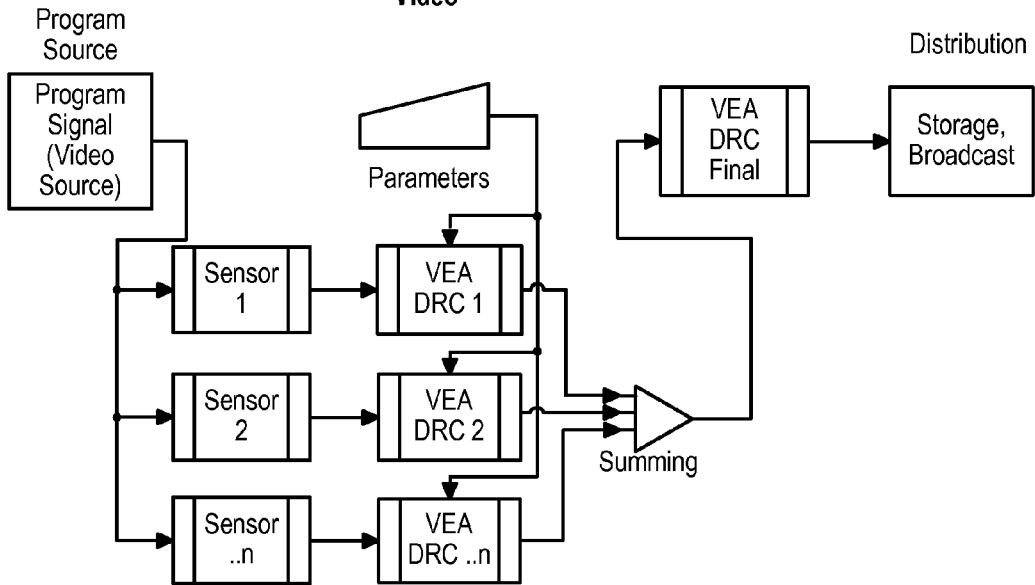
Figure 32 – Multi Thread Embodiment - Video
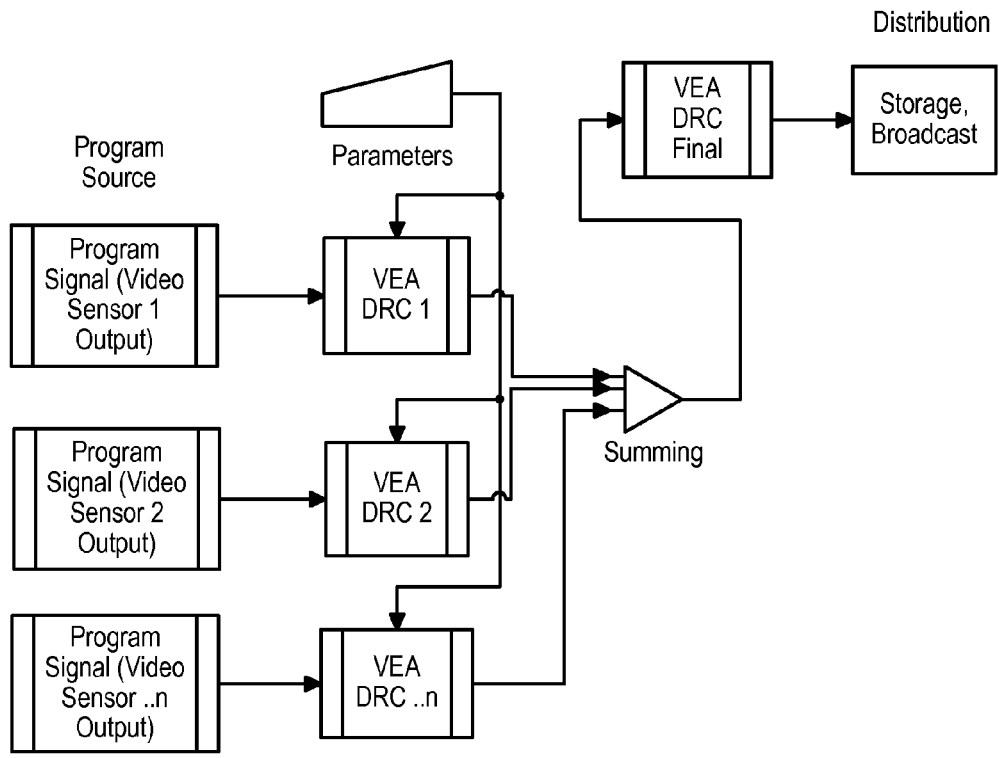
Figure 33 – Multi Thread Embodiment - Camera

VARIABLE EXPONENT AVERAGING DETECTOR AND DYNAMIC RANGE CONTROLLER

BACKGROUND OF THE INVENTION

1. Technical Field

The VEA Detector and Dynamic Range Controller of the invention concern the accurate measurement of constant or non-constant, periodic or aperiodic, signals and the use of such measurements to control the upstream and/or downstream processing of program signals, including without limitation audio, video, and power signals.

2. Related Art

In the field of program signal processing, for example, audio signal processing, "average" or "peak" signal level detectors in prior art dynamic range controllers detect input level changes by means of non-linear or time-variant filters imposed upon the envelope of the signal. Typically, first order filters have been used. Any such filter with unity gain at DC leaves the static performance of a dynamic range controller unchanged thereby allowing the non-linear processing of that filter to control dynamic signal changes independently.

Unfortunately, methods to control the dynamic response of automatic gain controls ("AGC's") that can be implemented using simple first-order linear filters are severely limited. An AGC typically does not limit maximum and minimum program signal values, but a dynamic range controller ("DRC") does limit maximum program signal values and can limit minimum program signal values.

The term "circuit" means a path of signal processing, and with respect to the invention, means a digital signal processing path. It is common to arrange a circuit that responds differently to increasing and decreasing signal levels, however such circuits are almost universally simply a selection between one of two linear filters based upon envelope change direction. Almost always these two filters are simple first order filters used to provide independent "attack" and "release" controls, and cannot separate DC, static, and dynamic control of a program signal.

Prior art audio DRCs, AGCs, and compressors typically provide a user with the ability to prevent distortion (e.g., overmodulation) and a minimum program signal value, but provide little or no ability to artistically "shape" the program signal to produce aesthetically pleasing processing effects related to program signal dynamics or to solve problems associated with dynamic changes. This inability arises in large part from the poor separation of static and dynamic control and the universal use of root mean square ("RMS") detection of program signal values.

Prior art video DRCs typically provide a user with no ability to artistically "shape" the program signal to produce aesthetically pleasing effects or to solve problems associated with dynamic changes. Video DRCs typically clip hotspots and crush blacks.

The prior art of signal detection in dynamic range controllers used various non-linear approximations to address complex waveforms and/or dynamic signals, and depended on first-order filters that provided limited or poor dynamic control over transfer functions, and failed to convey complex signal dynamics. Although some prior art detectors and DRCs perform signal detection and processing in the log domain, the performance of such devices is not noticeably better than (i) analog devices used with analog signals, or (ii) digital processing using "native" digital signals, e.g., WAV, AIFF, AU, and PCM.

The technical problem to be solved is to provide a means of separating control over DC, static, and dynamic action in the processing, transmission, or management of audio, video, and power signals. The preferred solution would employ an improved means of detection of program signal values, which improved means of detection would allow more flexible control over the "dynamics" of a program signal (i.e., how dynamically-varying signal are sensed as to their "magnitude" or "loudness", and the degree to which details of a varying signal are reduced or enhanced).

Additional technical problems to be solved are to improve the determination of average signal level of an audio program signal as perceived by the human ear, and determination of average signal level of a displayed video program signal as perceived by the human eye, and to better use the dynamic characteristics of a given program input signal to automatically or semi-automatically control the dynamic range of the program signal.

SUMMARY OF THE INVENTION

The Variable Exponent Averaging ("VEA") Detector and Variable Exponent Averaging Dynamic Range Controller ("VEA DRC") of the invention provide a means of separating control over DC, static, and dynamic action of a DRC. A "VEA Processor" has one or more VEA Detectors, optionally (but preferably) contains a Control Processor, and controls a digitally controlled amplifier ("DCA"). The combination of a DCA and a VEA Processor is a VEA DRC. "Control Values", without the prefix of "DCA" or the prefix "digitally controlled amplifier", are control values related to a VEA Detector or a VEA DRC. "DCA Control Values" relate to the control of a DCA by a VEA Processor. A VEA DRC processes a program signal as a function of Control Values. A "program signal" may be any digital bitstream or digital data structure of interest, particularly (i) digital audio, (ii) digital video (including still images, motion images, photogrammetric representations (e.g., light meters), and colorimetry (e.g., color meters)), (iii) digital representations of electrical power generation, storage, distribution, or consumption (collectively called, "electrical power signals"), and (iv) other digital bitstreams in which peak and/or average measurements of signal values are useful and/or in which dynamic control of signal values is useful.

The VEA Detector comprises a means of evaluating successive samples of program signal values by a convergent approximation by taking the X root of an average of the sum of the signal values raised to the same X power, and uses a counterintuitive antilog processing step in an otherwise log domain circuit. The successive samples conform to a given digital media format and system clock, using well-known standards and techniques. The VEA Detector not only provides a more accurate RMS value of a given program signal, it is the first device to provide a "root mean X" value of a given program signal, where X is an exponential value selectable by the user or by an external process. A more accurate RMS, or other root mean X, value of a program signal enables better control over the dynamics of a program signal. As an example of "better control", the VEA DRC improves dynamic control of a broad range of audio program signals, such as music, dialog, sound effects, and mixed combinations of these through improved "attack" (the response to increasing signal level) and "release" (the response to decreasing signal level) characteristics. A "selectable Control Value" can be manually adjusted or adjusted by one or more external processes. Selectable Control Values include exponent, attack exponent, release time (in dB/sec.), release exponent, fast release time, fast release threshold (in dB), knee width, ratio, input gain (in dB), output gain (in dB), look ahead, threshold n difference, and threshold master in embodiments of VEA Detectors that include the modules associated with those Control Values (e.g., exponent, attack exponent, release time, release exponent, fast release time, fast release threshold, knee width, ratio, input gain, output gain, look ahead, threshold n difference (where n equals the number of a VEA Detector subsystem connected to a Control Processor) and threshold master). All exponent Control Values are decimal numbers.

Although it is well-known to perform signal detection and processing in the log domain, the VEA Detector is the first to identify and utilize the benefits of linear (antilog) processing in carefully selected parts of an otherwise log domain circuits. The VEA Detector does so by means of an antilog module, which has been discovered by the inventor to be essential to providing a convergent approximation by the taking the X root of an average of the sum of the program signal values raised to the same X power.

A VEA Detector has a digital bitstream input of program signal. In a basic embodiment (see FIG. 5), the steps of generating a detector output, which is one type of Control Value, are: taking the absolute value of the input, conversion of the absolute value to a logarithmic representation ("log"), and applying the absolute value into an adding input of a first summing point (1stSP). The summing point also receives into a subtracting input a value derived from, and delayed from, the output of the summing point. The output of the summing point is fed to an input of a multiplier that also has an exponent input. The output of the multiplier passes through positive-signal-only module; the output of the positive-signal-only module is converted back to antilog in an antilog module. The antilog module output passes through an overshoot limiter and then into the adding input of a second summing point (2ndSP). The second summing point (2ndSP) has a second adding input and a single subtracting input. The output of the second summing point (2ndSP) is fed to the VEA Detector output and also to a delay module. The output of the delay module is looped back to an adding input of the second summing point (2ndSP) and also to the subtracting input on the first summing point (1stSP). A release bias value is fed into the subtracting input of the second summing point (2ndSP). The VEA Detector output is a digital signal that is used as a Control Value in an associated VEA DRC.

A VEA DRC, a preferred embodiment of which is shown in FIG. 14, comprises one or more VEA Detectors, the outputs of which VEA Detectors are compared and a single one (the maximum value among those compared) is selected for downstream use. The selected Control Value is converted to an antilog signal and fed into a control input of a multiplier (a DCA). The input program signal is fed to (i) the one or more VEA Detectors and (ii) through a variable delay, which delay is equal to the processing time required to generate the Control Value, and then into the program input of the DCA. The output of the DCA is processed program signal.

The VEA Detector improves the determination of average signal level of an audio program signal as perceived by the human ear, and determination of average signal level of a displayed video program signal as perceived by the human eye, and better uses the dynamic characteristics of a given program input signal to automatically control the dynamic range of the program signal.

BRIEF DESCRIPTION OF THE DRAWINGS

FIG. 15B shows the formula that relates input and output in the knee generator shown in FIG. 15A.

FIGS. 17A and 17B show a detailed view of the Control Processor in FIG. 16.

FIG. 21 shows a detailed view of a Control Processor in FIG. 20.

FIG. 22 shows a basic configuration of a VEA DRC for dynamic range control of program signals.

FIG. 23 shows a basic configuration of a VEA DRC for dynamic range control of audio program signals.

FIG. 24 shows a basic configuration of a VEA DRC for dynamic range control of video program signals.

FIG. 25 shows a basic configuration of a VEA DRC for dynamic range control of generic program signals.

FIG. 26 shows a basic configuration of a VEA Detector for use as a program signal measurement device.

FIG. 27 shows a configuration of two VEA DRCs for comparisons and patterning matching between two program signal inputs.

FIG. 28 shows a configuration for a VEA DRC for audibility of program signal based on ambient sonic environment.

FIG. 29 shows a configuration for a VEA DRC for improvement of display of video program signal based on ambient light environment.

FIG. 30 shows a configuration of multiple VEA DRCs for dynamic range control of audio program signals.

FIG. 31 shows a configuration of VEA DRCs for processing chroma and luminance components of a video program signal.

FIG. 32 shows a configuration of three VEA DRCs for processing three components from a single program signal, typically red, blue, and green, from a video program signal.

FIG. 33 shows a configuration of three VEA DRCs for processing three pickup sensors, for instance, red, blue, and green sensors in a video camera.

DETAILED DESCRIPTION OF THE PREFERRED EMBODIMENTS

Figure 1:
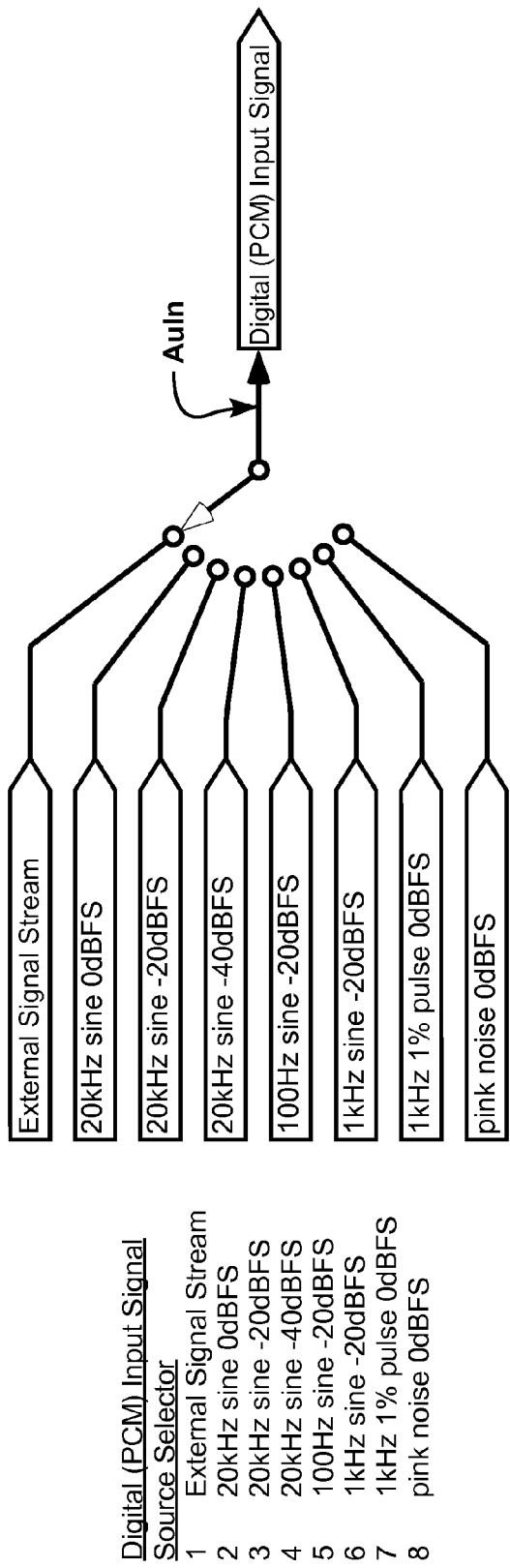
FIG. 1 shows a signal selector, which can be used to demonstrate the performance of the VEA DRC in response to different types of signals.

The Variable Exponent Averaging ("VEA") Detector and Variable Exponent Averaging Dynamic Range Controller ("VEA DRC") of the invention provide a means of separating control over DC, static, and dynamic action of a dynamic range controller. A "VEA Processor" has one or more VEA Detectors, and optionally includes a Control Processor. A VEA Processor always has at least one VEA Detector. If a VEA Processor has two or more VEA Detectors or Detector subsystems, then it may also have a Control Processor to prioritize or otherwise integrate or select the outputs of the two or more VEA Detectors and Detector subsystems. A VEA Processor controls a digitally controlled amplifier ("DCA") or other digital processor (e.g., comparator, pattern discriminator, etc.). The combination of a VEA Processor and a DCA is a VEA DRC. For ease of reference, the combination of a VEA Processor and other digital processor to which a VEA Processor provides a Control Value is also called a VEA DRC, although such other digital processor may output a signal other than an amplified program signal.

"Control Values", without the prefix of "DCA" or the prefix "digitally controlled amplifier", are control values related to a VEA Detector or a VEA DRC. "DCA Control Values" relate to the control of a DCA (or other digital processor to which a VEA Processor provides a Control Value) by a VEA Processor. A VEA DRC processes a program signal as a function of Control Values. A "program signal" may be any digital bitstream or digital data structure of interest, particularly (i) digital audio, (ii) digital video (including still images, motion images, and photogrammetric representations (e.g., light meters, color meters), (iii) digital representations of electrical power generation, storage, distribution, or consumption, and (iv) other digital bitstreams in which peak and/or average measurements of signal values are useful and/or in which dynamic control or comparison of signal values is useful.

A "module" is a digital signal-processing step, and a module is shown in the Figures as a shape, e.g., rectangle, circle, etc. The terms "Control Processor", "ratio control", and "knee generator" are defined in the discussion of FIGS. 12 and 14-21. The term "circuit" means a path of signal processing, and when used with a modifying phrase refers to a particular signal processing path within a VEA Detector or VEA DRC, e.g., a "static release circuit". A "user" is a human user of the invention; users can provide selectable Control Values to a VEA Detector or a VEA DRC. An "external process" is an instance of and execution by another software application or hardware equivalent that provides a selectable Control Value to a VEA Detector or a VEA DRC. The software that codes the invention can be written in any programming language (e.g., C, C++, ObjectiveC) typically used to handle digital audio, digital video, and other digital media or data, depending on the program signal type. Embodiments of the invention for digital audio can be written for standalone use or as plug-ins for audio workstations, e.g., plug-ins for PRO TOOLS™ workstation software. Embodiments of the invention for digital video can be written for standalone use or as plug-ins for video workstations, e.g., plug-ins for AVID MEDIA COMPOSER™.

The term "exponentiating" means raising a value to an exponential power. For example, to exponentiate a value to the second power means to square the value; to exponentiate a value to the third power means to cube the value.

The VEA Detector comprises a means of determining program signal values by a convergent approximation by taking the X root of an average of the sum of signal values raised to the same X power, and uses a counterintuitive antilog processing step in an otherwise log domain circuit. The external interfaces of a VEA Detector operate in a base domain that is linear or extremely close to linear, but the internals of a VEA Detector operate in the log domain, thereby providing a VEA Detector with the ability to accommodate a much wider dynamic range of program signal values than prior art devices. The VEA Detector not only provides a more accurate RMS value of a given program signal, it is the first device to provide a "root mean X" value of a given program signal, where X is an exponential value selectable by the user or by automation. A more accurate RMS, or other root mean X, value of a program signal enables better control over the "dynamics" of a program signal. This is particularly important if the program signal will be data compressed (reduced in file size or transmission bit rate), since poorly controlled dynamic changes produces distortion and artifacts in data compression. Selectable Control Values can be manually adjusted by a user or adjusted by an external process.

The VEA Detector and VEA DRC inventions are typically embodied in software, but can be embodied in firmware, in digital signal processing chips, or in other semiconductor-based or vacuum-tube-based devices.

FIG. 1 shows a source selector, which is external to the invention. The input to a VEA Detector is a digital program signal, which may be recorded or live. In audio embodiments, the program signal is typically a pulse code modulated ("PCM") signal. In embodiments of the invention for video, time/amplitude industry standard digital video formats are used as the input program signal. In embodiments of the invention for numeric data, "time/numeric value" data formats are used as the input program signal. The invention is also adaptable to processing spectral density and other transforms of program signals. The source selector allows a choice of various internal, external, and test signals for use as program signal. Although sine wave, a pulse wave, and pink noise are shown as possible test signal sources in FIG. 1, other test signals may be used. Test signals, esp., non-sine wave, are useful in demonstrating the more accurate determination of the RMS and root mean X values of an program signal input by a VEA Detector.

Figure 2:
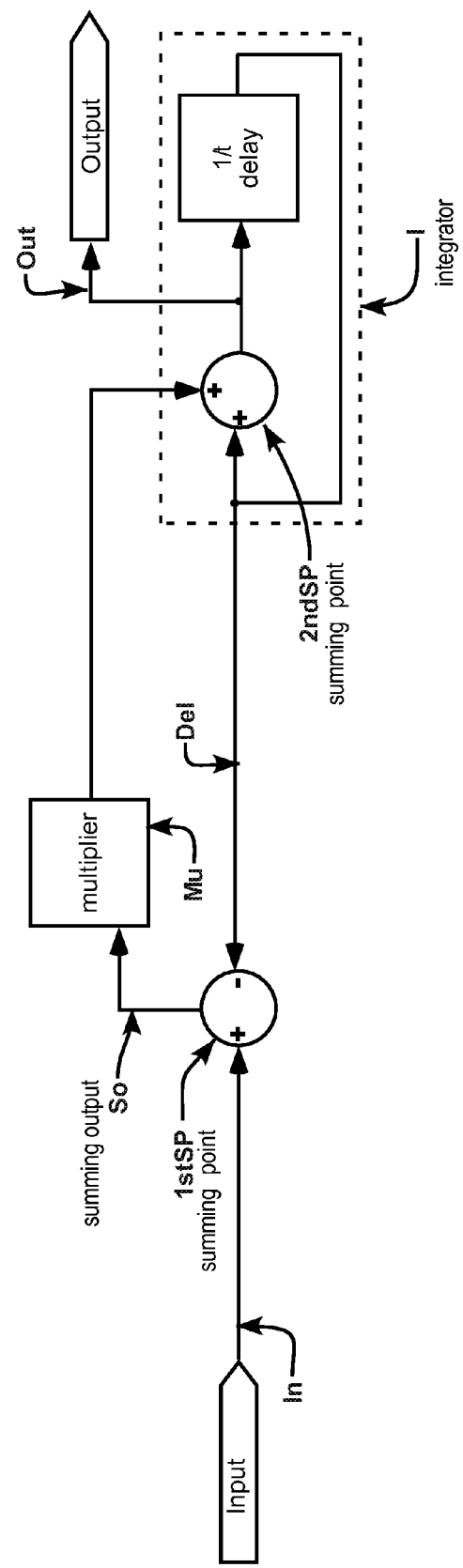
FIG. 2 shows a prior art first order digital filter.

FIG. 2 shows a simplified version of a common, well-known first-order, digital filter, operating in the base (i.e., not logarithmic, or "non-log") domain. The input (In) to this prior art digital filter feeds an adding input on a first summing point (1stSP). The output (So) of the first summing point (1stSP) feeds multiplier. The output of the multiplier (Mu) feeds a second summing point (2ndSP). A delay module and the second summing point form an integrator ("I"). The integrator (I) has two outputs labelled "Out" and "Del". The summing point in the integrator (I) has two inputs, an adding input connected to the output of the multiplier (Mu), and a second adding input, connected to a branch of the output of the delay module. The output (Del) from the integrator (I) is connected to a subtracting input on the first summing point (1stSP). The multiplier (Mu) multiples its input (So) using a preset constant. This arrangement for the implementation of a "leaky integrator", or first order low pass filter, has the advantage that the DC gain is always exactly unity and a single coefficient (the multiplier constant) controlling multiplication in the multiplier controls the time-constant or cut-off frequency.

Figure 3:
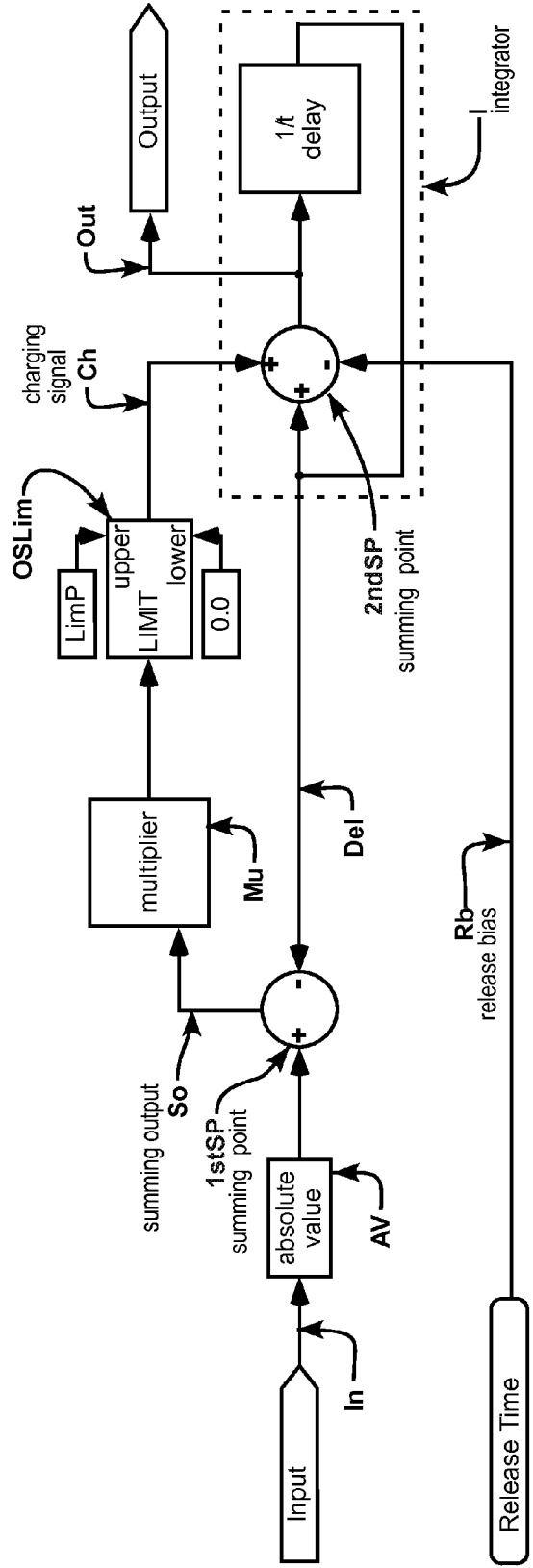
FIG. 3 shows a prior art first order digital filter configured as an average signal level detector, with optional overshoot limit, or OSLim, module.

In FIG. 3, the method from FIG. 2 is extended, but still operates in the base (non-logarithmic) domain and is known in the prior art. In FIG. 3, an absolute value module (AV), an overshoot limit module (OSLim), and a release time module are added to the system shown in FIG. 2. First-order filtering is now non-linear, and is applied differently when the signal is going positive (i.e., the signal level is increasing) or negative (i.e., when the signal level is decreasing) compared to the output of the system in FIG. 2. The absolute value module (AV) takes the absolute value of the input (In) and feeds it to an adding input of the first summing point (1stSP). A preselected "release" offset Rb is connected to a subtracting point of the second summing point (2ndSP) and is subtracted at all times, forcing the integrator (I) output to decay ("release"), or become more negative, until the output (Ch) of the overshoot limit module (OSLim) equals the release bias (Rb) set by the release time module, at which point the output is stable. In this arrangement the output does not equal the input (In) at equilibrium, i.e. there is a permanent offset derived from release bias (Rb). The signal flow of FIG. 3 is, like FIG. 2, equivalent to a simple first-order low-pass filter, but in a positive-going direction only. The additional modules in FIG. 3 affect the filter output (Out) differently when the first summing point output (So) is positive than when the first summing point (1stSP) output (So) is zero or negative; the detector is, therefore, non-linear.

The overshoot limit module (OSLim), as shown in FIG. 3 and in later Figures, imposes a minimum level, or floor, and a maximum level, or ceiling, on signals passed through it. The overshoot limit module output (Ch) is connected to an adding input of the second summing point (2ndSP) in the integrator (I); as discussed above, a branch of the delay module output is connected to an adding input of the second summing point (2ndSP), and the release bias, aka "timing offset, (Rb) value is subtracted from the contents of the second summing point (2ndSP) in the integrator (I). The filter output (Out) can be used to control a base (non-log) domain dynamic range controller, or other signal processing device.

The filters of FIGS. 2 and 3 function as detectors as a result of their filtering action. In FIG. 3, the detector output does not equal the detector input at equilibrium (static performance) because release bias (Rb) reduces the level of integrator (I) output.

Figure 4:
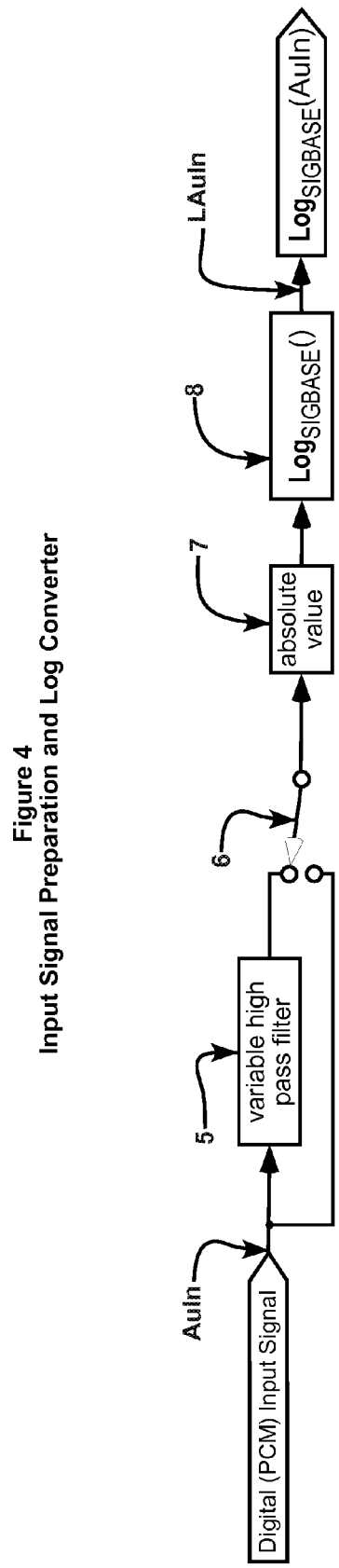
FIG. 4 shows the input signal processing of the VEA DRC.

FIG. 4 shows, with the omission of many modules downstream from LogSigBase( ) module (8), the first step in the signal processing chain of a VEA Detector. For convenience, the subscript SigBase is shown as non-subscript in this Description, but there is no difference in meaning between subscripted and non-subscripted terms with the same spelling, regardless of capitalization of such terms. The incoming signal (AuIn) is high-pass filtered (module 5), and the output of the variable high pass filter may be selectively chosen by a switch (6) to remove out-of-band signals that might interfere with the detection of more relevant signals. Although not shown in FIG. 5 and higher, the absolute value module (7) and the LogSigBase( ) module (8) are necessary elements upstream from the LogSigBase(AuIn) module in all embodiments of a VEA Detector. Although not shown in FIG. 5 and higher, a high-pass filter module (5) and switch (6) are optional modules in all embodiments of a VEA Detector. The signal selected by the switch (6) is the input to module 7, which produces an output that is the positive, absolute value of the input to module 7. The output of module 7 is the input to a LogSigBase( ) converter (8). The output signal of the LogSigBase( ) converter (8) is a logarithmic (i.e., dB) representation of absolute value of the input to the LogSigBase( ) converter (8). The precision and scale of the converter LogSigBase( ) are such that the module (8) output representation of input signals results in an output of 0.103818 per decade (a 20 dB difference (base 10) in the base domain as input to the LogSigBase( ) converter (8) equates to a factor of 10 in input values and a difference of 0.103818 in the log domain output of the LogSigBase( ) converter (8)). Converting the signal to its dB representation reduces multiplication to addition by the well-known formula, $\log(xy) = \log x + \log y$. It also reduces exponentiation to multiplication by the well-known formula $\log(x^n) = n \cdot \log(x)$.

In preferred embodiments, there are more processing modules following the LogSigBase( ) module (8), but to complete the simplified signal chain shown in FIG. 4, signals could be converted back to linear domain by an AntiLogSigBase( ) converter module (not shown). The precision and scale of an AntiLogSigBase( ) module are such that the output in base domain increases 20 dB (or, times 10) using base 10 in the base domain for every 0.103818 step in AntiLogSigBase( ) module input signal in log domain. In FIG. 4, the output (LAuIn) is maintained in the log domain and becomes the input to a VEA Detector, such as the one shown in FIG. 5; the output (LAuIn) is fed to the LogSigBase(AuIn) module of a VEA Detector.

Figure 5:
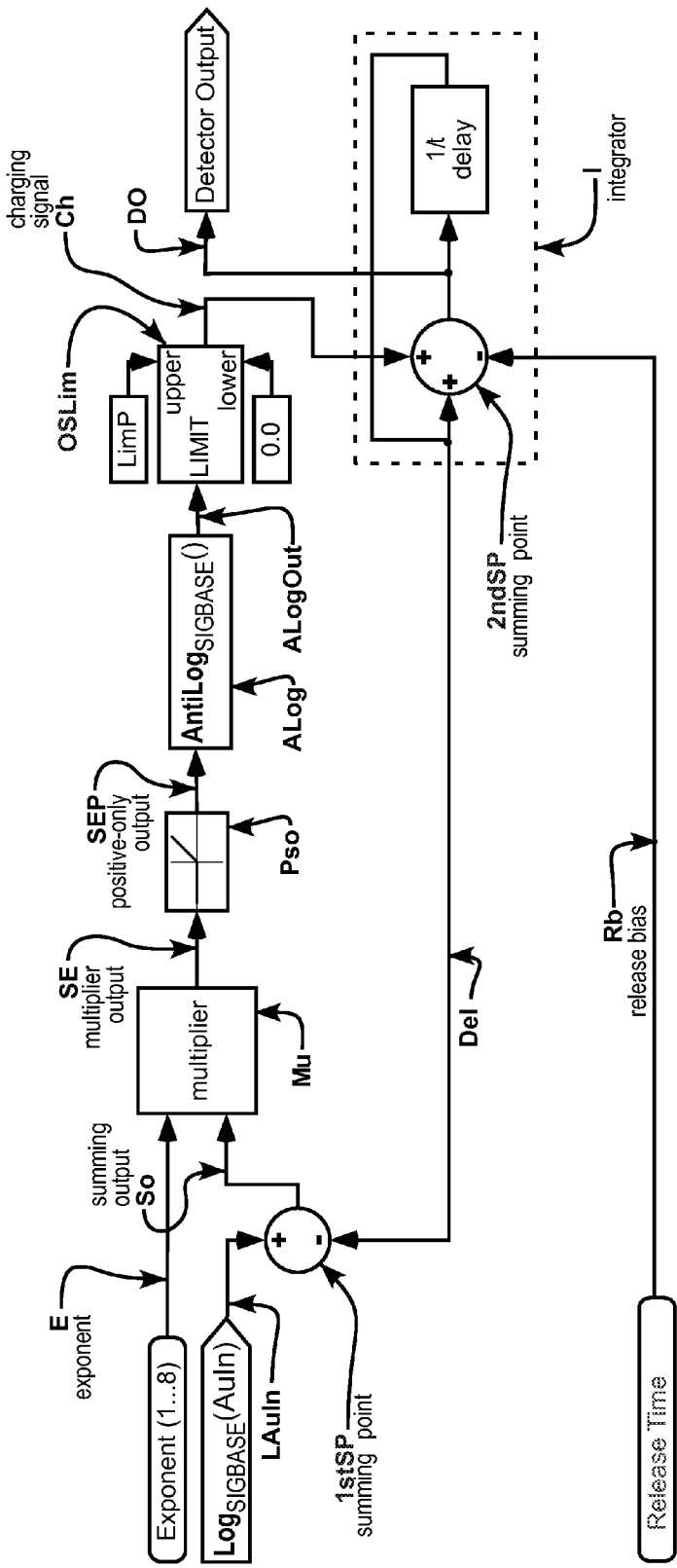
FIG. 5 shows a basic embodiment of a VEA Detector, with an antilog module upstream from an overshoot limit module.

FIG. 5 shows a basic embodiment of a VEA Detector. The core element of all embodiments of the invention is the AntiLogSigBase( ) module used to drive integrator (I); the AntiLogSigBase( ) module is used in every VEA Detector. The steps of generating a VEA Detector output, which is one type of Control Value, are: taking the absolute value of the input (described in the discussion of FIG. 4), conversion of the absolute value to a logarithmic representation ("log") (described in the discussion of FIG. 4), and applying the absolute value, LogSigBase(AuIn), to an adding input of a first summing point (1stSP). The first summing point (1stSP) also receives through a feedback loop into a subtracting input a value (Del) derived from, and delayed from, the output of a second summing point (2stSP). The output (So) of the first summing point (1stSP) is fed to an input of a multiplier (Mu) that also has an exponent (E) input. The exponent (E) is a selectable Control Value. The multiplier (Mu) output (Se) passes through positive-signal-only module (Pso); the output (SEP) of the positive-signal-only module (Pso) is converted back to antilog in an antilog module (ALog). The antilog module (ALog) output (ALogOut) feeds an overshoot limit module (OSLim). The output (Ch) of the overshoot limit module (OSLim) feeds an adding input of a second summing point (2ndSP). The second summing point (2ndSP) has a second adding input and a single subtracting input. The output of the second summing point (2ndSP) is fed to the VEA Detector output and also to a delay module. The output of the delay module is looped back to the second adding input of the second summing point (2ndSP) and also to a subtracting input on the first summing point (1stSP). A release bias value (Rb) is fed from a release time module into the subtracting input of the second summing point (2ndSP). The VEA Detector output is a digital signal that is used as a Control Value in an associated VEA DRC or other processor.

FIG. 5 is a simplified version of the VEA Detector control circuit. FIGS. 4 and 5 combined show the minimum preferred embodiment of a VEA Detector. The absolute minimum embodiment of a VEA Detector omits the high-pass filter (5) and switch (6) in FIG. 4 and the release time module, release bias (Rb), positive-signal-only module (Pso), subtracting input of the second summing point (2ndSP), and the overshoot limit module (OSLim) in FIG. 5; in such absolute minimum embodiment, the multiplier output (SE) would be connected to the input of the AntiLogSigBase( ) module (ALog) and the output of the AntiLogSigBase( ) module (ALogOut) would be connected to the first adding input of the second summing point (2ndSP). The absolute minimum embodiment might suffer from peak overshoots and the output would not decay based on the release bias (Rb) value, but the VEA Detector would function.

A VEA Detector operates in the log domain. LogSigBase (AuIn) is a dB representation of the program signal input to the VEA Detector, as explained in description of FIG. 4. In the VEA Detector of FIG. 5, the output (DO) does not equal the input (LAuIn) at equilibrium because of the variable offset introduced by the combination of release bias (Rb) and charging signal (Ch).

The charging signal (Ch) is a base domain value (ALogOut) obtained from the ALog module after exponentiation using exponent (E) of the first summing point (1stSP) output (So) in log domain multiplier (Mu), and selection of positive values in the positive-signal-only module (Pso). The positive-signal-only module (Pso) passes all positive inputs without modification but blocks (outputs zero for) all negative inputs. The signal flow of the preferred embodiment in FIGS. 4 and 5 is somewhat similar to a first-order, non-linear low-pass filter, but processing is performed in the log domain and makes novel use of an AntiLogSigBase module.

The value of exponent (E) can be selected manually by the user, fixed, or provided by other modules, such as an attack module, discussed below. An antilog converter, AntiLogSigBase( ) module (ALog) is inserted in the signal path between the positive-signal-only module (Pso) and overshoot limit module (OSLim), and converts the dB representation of the positive-signal-only module (Pso) to an antilog value (ALogOut) of the positive log domain product of (So) times (E). This use and processing of a variable exponent (E) provides very desirable, novel, and unexpected results. Calculation 1 summarizes the processing in FIG. 5.

Calculation 1
So=LAuIn−Del
SE=So*E
Ch=ALogOut=AntiLogSigBase(So*E)
Ch=AntiLogSigBase(SE)
Or:
SE=LogSigBase(Ch)
At equilibrium, Ch=Rb
SE=LogSigBase(Rb)
So=SE/E
So=LogSigBase(Rb)/E At equilibrium, DO=Del
Del=LAuIn−So
CO=LAuIn−LogSigBase(Rb)/E
Thus, the induced offset (DO−LAuIn)=−LogSigBase(Rb)/E The dynamic (transient) action of such a configuration with an AntiLogSigBase( ) module acting within the context of a log domain circuit is that the "averaging" at the integrator (I) is linear, not logarithmic. However, since the detection is within the log domain, the dynamic range of the VEA Detector is exponentially larger. These results are very desirable, novel, and unexpected.

Exponent (E) is variable in all embodiments of the invention, and a VEA Detector is able to provide a convergent approximation using the following sequence of operations: (a) "exponentiating" successive signal samples to the "nth" power, where "n" equals the selectable Control Value exponent (E); (b) averaging the results of such exponentiation; and then (c) taking the "nth" root of the average of the sum of signal values. This is desirable because the perceived magnitude of the envelope of complex real-world signals does not necessarily correspond to a simple RMS measurement. Complex, real-world program signals (such as a symphony performance, video camera pickup of a football game in a half-shaded playing field, or analysis of satellite reconnaissance imagery) often respond better to dynamic range control that uses higher-power (greater than 2) exponential averaging and root taking.

Although the dynamic (transient) action provided by the configuration of FIG. 5 may be as desired, the static action has been disturbed. Performance can be improved by adding a static release (aka static discharge) value to the first summing point (1stSP).

Figure 6:
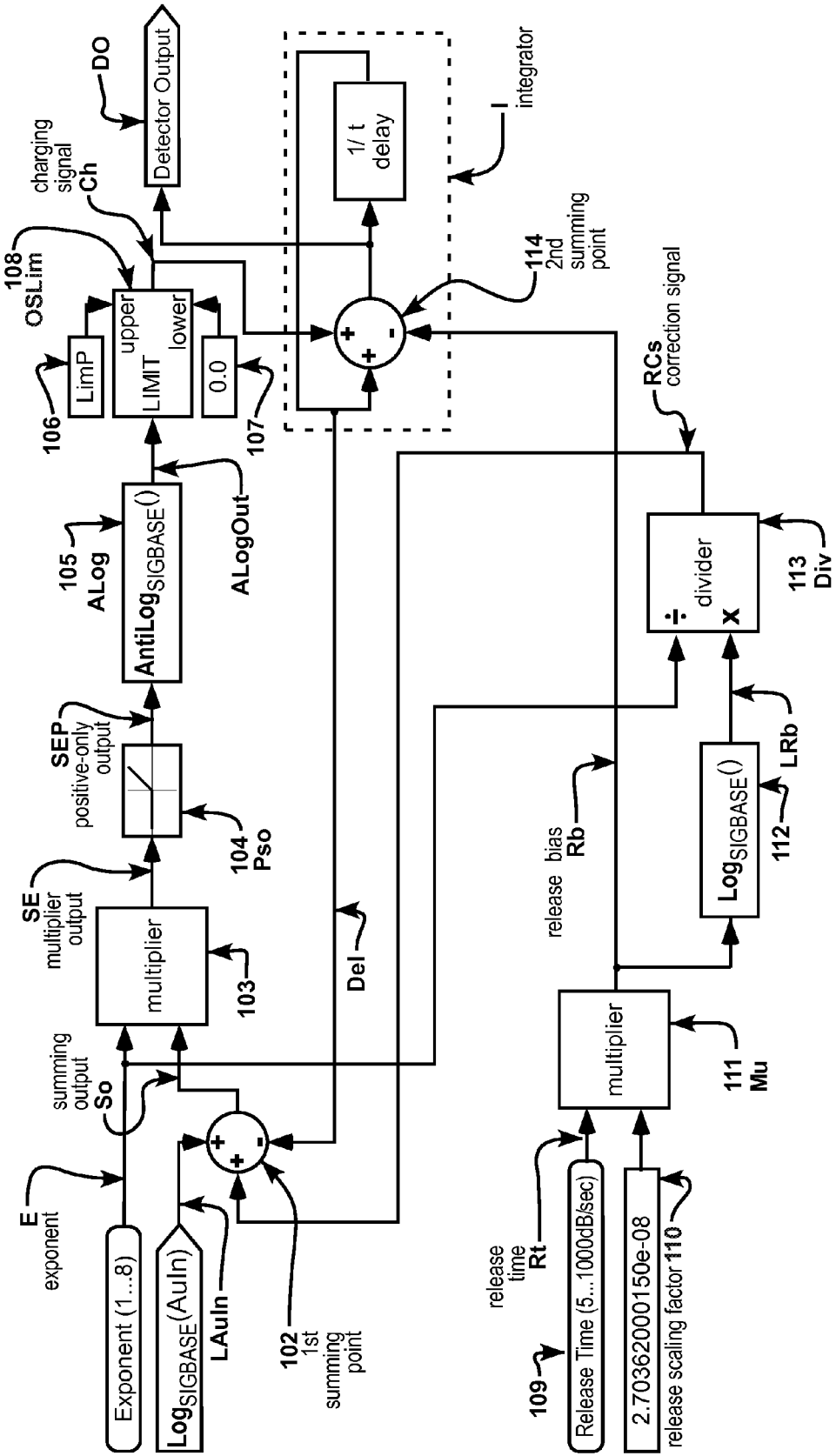
FIG. 6 shows an embodiment of a VEA Detector, with an antilog module upstream from an overshoot limit module, and with corrected static release.

As shown in FIG. 6, to add a static release value to the first summing point (102), a release correction signal (RCs) is generated in several steps. The steps added in FIG. 6 to generate and apply the static correction signal (RCs) are called the "static release circuit". The first step uses (i) a release, or RT, scaling factor (110) of approximately 2.70362000150e-08, and (ii) a dB/sec release time value (Rt), in dB/sec., as inputs to a second multiplier (111). The release time (Rt) is called the "static release rate" and is a selectable Control Value from a Release Time module (109), i.e., release time (Rt) can be manually selected by the user, fixed, or controlled by an external process (not shown). The output (Rb) of the second multiplier (111) is a product in the base domain and is connected both to a log converter (112) and to the subtracting input on the second summing point (114). Release bias (Rb) is converted to dB representation by log converter (112); the output (LRb) of log converter (112) is applied to a multiplying input of divider (113); a second branch of the Exponent module output (E) is applied to the dividing input of divider (113). The output (RCs) of divider (113) is connected to an adding input of the first summing point (102). In the configuration of the VEA Detector shown in FIG. 6, the offset (−Log(Rb)/E) calculated in Calculation 1 above as needed to correct for static decay is generated by the modules described in this paragraph, which modules and interconnections are called the "static decay correction path", and added into the first summing point (102) such that the static (equilibrium) action of the VEA Detector is Out=In, as logically proved in Calculation 2. The multiplier (103), positive-signal-only module (104), and antilog convertor module (105) operate the same way as the multiplier (Mu), positive-signal-only module (Pso), and antilog module (ALog) in FIG. 5. The OSLim module (108) with upper limit (106) and lower limit (107) limit overshoot of signal level.

Calculation 2

So=LAuIn+RCs−Del
Se=E*So
Ch=AntiLogSigBase(SE)
At equilibrium, Ch=Rb
DO=Del
LRb=LogSigBase(Rb)
RCs=LRb/E
From eqn. 3 and 4: Rb=AntiLogSigBase(SE)
From eqn. 2: Rb=AntiLogSigBase(E*So)
From eqn. 1: Rb=AntiLogSigBase(E*(LAuIn+RCs−Del))
From eqn. 7: Rb=AntiLogSigBase (E*(LAuIn+(LRb/E)−Del))
From eqn. 5: Rb=AntiLogSigBase (E*(LAuIn+(LRb/E)−DO))
From eqn. 6: Rb=AntiLogSigBase (E*(LAuIn+(LogSigBase(Rb)/E)−DO))

This becomes:
LogSigBase (Rb)=E*(LAuIn+(LogSigBase(Rb)/E)−DO)
LogSigBase (Rb)=E*LAuIn+E*(LogSigBase(Rb)/E)−E*DO
LogSigBase (Rb)=E*LAuIn+LogSigBase(Rb)−E*DO
E*DO+LogSigBase(Rb)=E*LAuIn+LogSigBase(Rb)
E*DO=E*LAuIn
DO=LAuIn This is true for all values of exponent (E) and release time (Rt).

Figure 7:
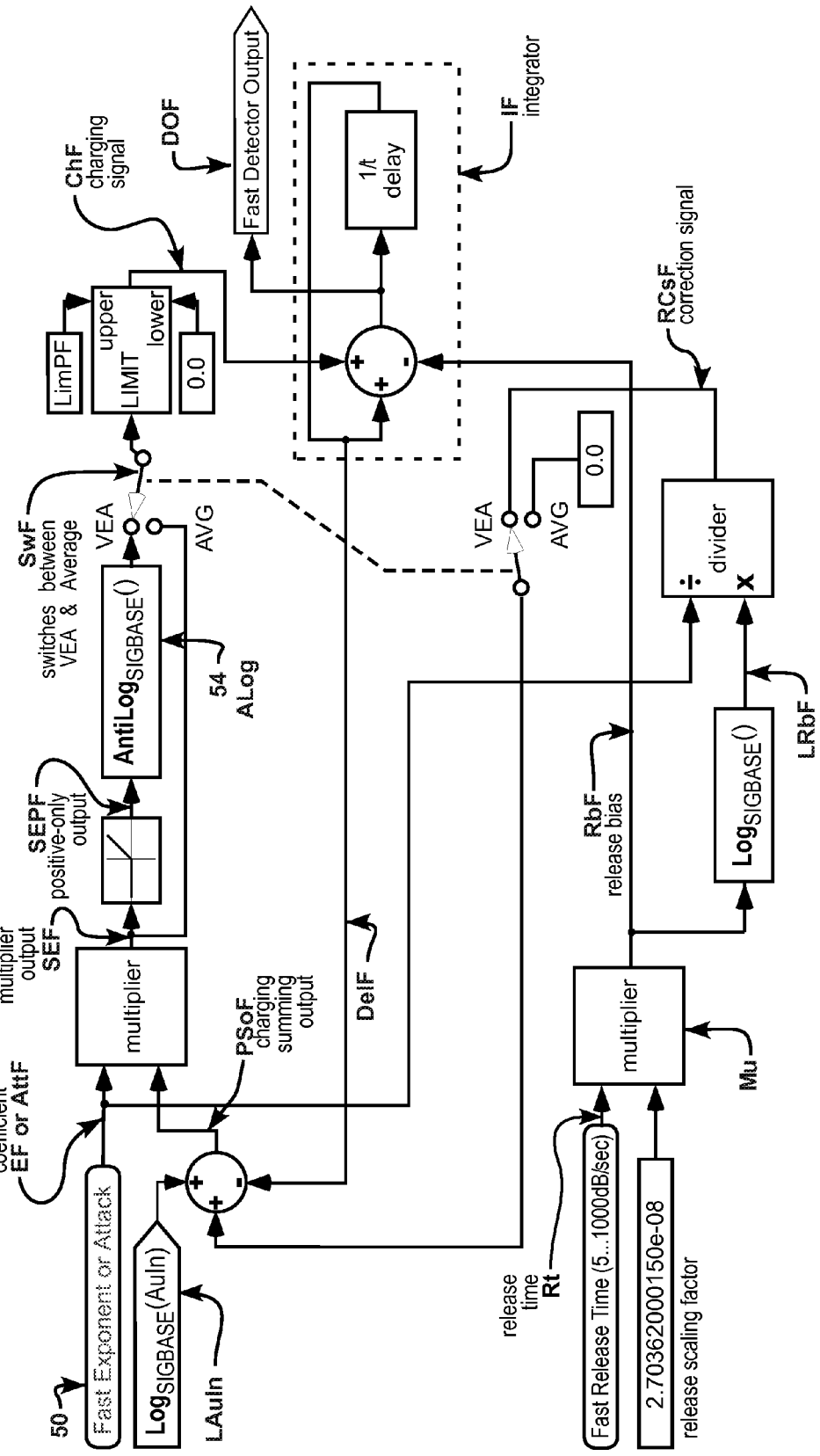
FIG. 7 shows a preferred embodiment of a VEA Detector, with an antilog module upstream from an overshoot limit (aka OSLim) module, and with a Fast Detector switchable between VEA and "averaging in the logarithmic domain" operation.

In FIG. 7 the method from FIG. 6 is modified to add a switch (SwF) so that the detection mode of the VEA Detector can be selected to operate as either a VEA Detector, or an Averaging Detector (in the log domain). The switch (SwF) can be manual, or under control of an external process (not shown). A second modification in the method of FIG. 7 is the selection of exponent (EF) in module (50) to a higher value, which causes a faster attack and release in dynamic control compared to an exponent (EF) value of 2. The VEA Detector design of FIG. 7 is called a "VEA/Average Switchable Fast Detector". When switch (SwF) is set to VEA, the static release correction circuit and the ALog module (54) are active. When switch (SwF) is set to AVG, the static release correction circuit and the ALog module (54) are bypassed and the detector of FIG. 7 functions as an RMS detector if exponent (EF) is set to 2.

The "Fast VEA Detector" is set to be substantially faster in attacking (onset of compression, or "attack") and releasing (reversal of compression, or "release") a program signal compared with a VEA Detector with a lower exponent (E) value. When the Fast VEA Detector operates in Average (in the log domain) mode, the bypass of the AntiLogSigBase module (54) means that the integrator (IF) is charged at a slower rate, since the Average Control Value applied to integrator (IF) is a log value, as opposed to a much larger antilog value from the AntiLogSigBase module (54) when the switch (SwF) is set to VEA mode.

Figure 8:
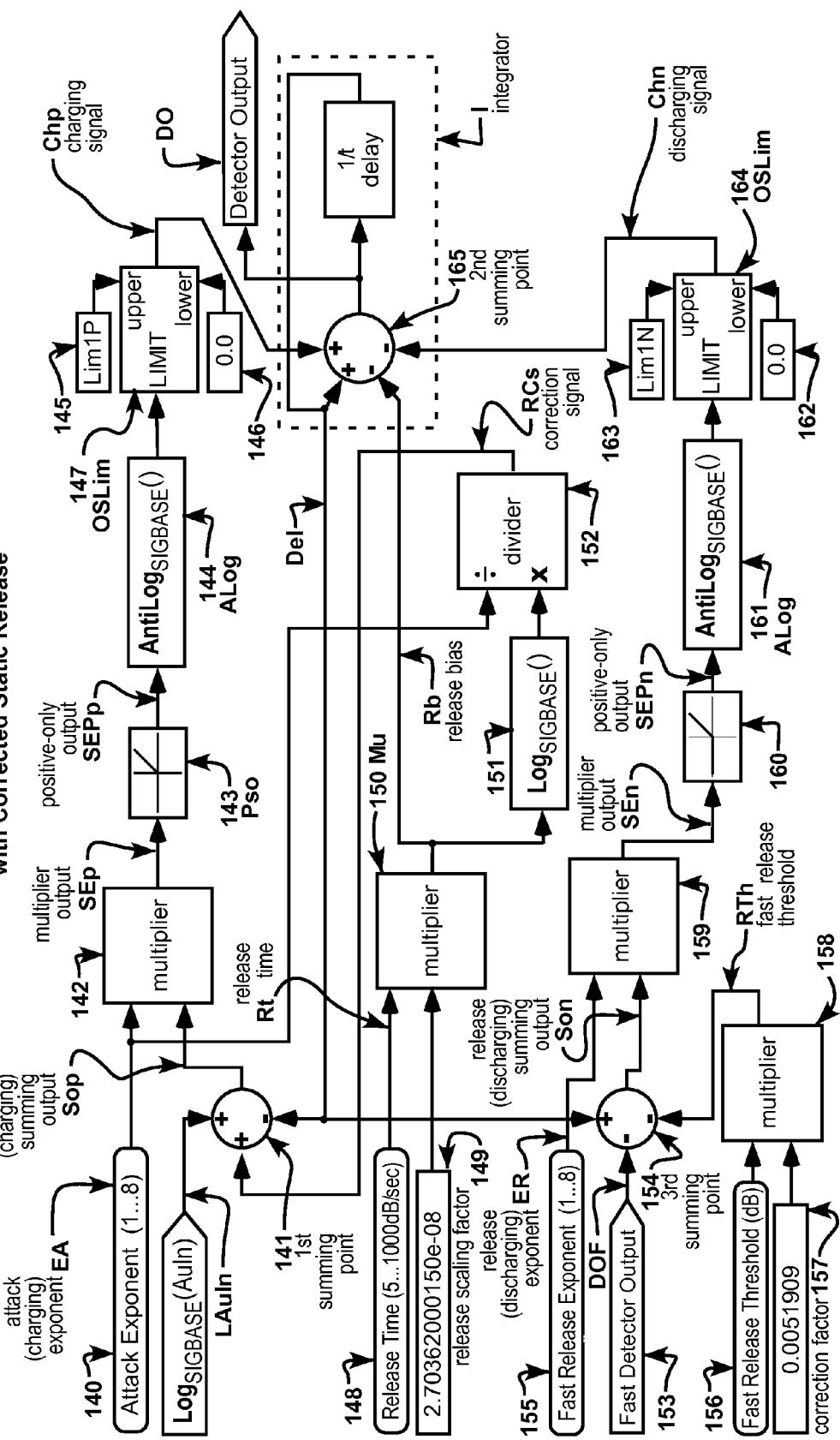
FIG. 8 shows a preferred embodiment of a VEA Detector sub-system that provides a Detector Output.

As shown in FIG. 8, the output (DOF) of a Fast VEA Detector (shown in FIG. 7) can be used as an input (153) to a "VEA Detector discharge circuit" (FIG. 8, modules 153-164) to accelerate the release, or "discharge" of compression of the program signal. Control of the VEA Detector discharge circuit can be either under manual control (by adjusting the selectable Control Value (ER) set by the fast release exponent module (155) and/or adjusting the selectable Control Value set by the Fast Release Threshold module (156) to cause a change of output (RTh) of multiplier (158) in FIG. 8), or under control of an external process (not shown) that adjusts the selectable Control Values (ER) and/or the Fast Release Threshold set in module (156).

In FIG. 8, the method from FIG. 6 is extended by the introduction of two VEA Detectors into a VEA Detector subsystem, both of which VEA Detectors are used to process the signal (LAuIn) from an LogSigBase(AuIn) module and generate a Control Value at the Detector Output (DO). One VEA Detector charging circuit (modules 140-147) uses the program signal (LAuIn) from the LogSigBase(AuIn) module in FIG. 8 and generates a charging, or "Attack", value connected to an adding input to integrator (I), and the other VEA Detector discharging circuit (modules 153-164) uses the Fast Detector subsystem output (DOF) from FIG. 7 as an input in module (153) and can increase the rate of discharge, or "release", of the integrator (I), thereby increasing the discharge rate of the VEA Detector of FIG. 8 (using the "discharge signal" (Chn)) beyond that which is provided by the static release signal (Rb). The static release signal, or "release bias", (Rb) uses the method presented in FIG. 6, and in FIG. 8 is generated by modules 148 to 150. The correction for static release effect on integrator (I) is provided by correction signal (RCs) from modules 151 and 152, connected to an adding input on the 1st summing point (141), using the same method as presented in FIG. 6. The static release signal (Rb) is connected to a subtracting input of the second summing point (165). These signals (Rb and RCs) are described in the discussion of FIG. 6.

The Fast VEA Detector output (DOF) of FIG. 7, connected through module (153) as an input in FIG. 8, is used in the VEA Detector of FIG. 8 in a "VEA Detector fast discharge circuit" (FIG. 8, Modules 153-164). The VEA Detector fast discharge circuit accelerates the release, or "discharge" of integrator (I) (more accurately, of the second summing point (165)) in FIG. 8. The fast release exponent (ER) Control Value of the fast release exponent module (155) and the fast release threshold module (156) Control Value are selectable Control Values, either under manual control, or under control of an external process (not shown). Adjustment of the Fast Release Exponent (ER) Control Value of the Fast Release Exponent module (155) and/or the Fast Release Threshold module (156) Control Value allows variable control of the output (RTh) of multiplier (158). Manual control of the Fast Release Threshold module (156) Control Value, which in turn adjusts the output (RTh) of multiplier (158), is shown in FIG. 8. The "VEA Detector fast discharge circuit" (modules 153-164) is driven by decreases in Fast VEA Detector output (DOF) (153) signals, which are generated by either a VEA Detector or VEA Detector switched to Average mode (log domain bypassed) (see FIG. 7). In either case, the VEA Detector fast discharge circuit responds much more quickly than the static release circuit of FIG. 8 (modules 148-150) to changes in program signal. The Control Value applied to the Fast Release Threshold module (156) sets the sensitivity of the VEA Detector fast discharge circuit to decreasing input signal levels. The Fast Release Threshold Control Value, calibrated in dB, is multiplied in multiplier (158) and the output (RTh) of multiplier (158) is connected to a subtracting input at a third summing point (154). When the Fast Detector output (DOF) falls more quickly than integrator (I) output (Del) and the fast release threshold control value (RTh) decreases, the result is a positive output at the output (Son) of third summing point (154). The output of third summing point (154) is connected to one input of multiplier (159); the other input to the multiplier is the Control Value (ER) from the fast release exponent module (155). The output (SEn) of multiplier (159) is connected to positive-signal-only module (160). A positive output at the output (Son) of third summing point (154), after multiplication in multiplier (159), generates a positive output at the positive-signal-only module (160). The positive-signalonly module (160) passes all positive inputs without modification but blocks (outputs zero for) all negative inputs. The output of the positive-signal-only module (160) is the input to an AntiLogSigBase( ) module (161) that converts the log domain input to the base domain. The output of the Anti-LogSigBase( ) module (161) is the input to an overshoot limit module (164). The output (Chn) of the overshoot limit module (164) is applied to a subtracting input of the second summing point (165) in integrator (I). Because the output (Chn) of the overshoot limit module (164) is either zero or positive, and is applied to a subtracting input of the second summing point (2ndSP), a positive output (Chn) discharges integrator (I).

By the conversion of the log domain Control Value (SEPn) to a base domain antilog in the AntiLogSigBase( ) module (161) in the VEA Detector fast discharge circuit (modules 153-164), the effect of "discharging" increases exponentially as the signal level magnitude decreases. These results are very desirable, novel, and unexpected.

The basic embodiment of a VEA DRC has one VEA Detector. Preferred embodiments of a VEA DRC have multiple VEA Detector subsystems. A preferred VEA Detector subsystem has multiple VEA Detectors, each configured differently by choosing various Control Values under manual or external process control. One preferred VEA DRC includes three VEA Detector subsystems, called "Detector 1", "Detector 2", and "Fast Detector", respectively.

Figure 9:
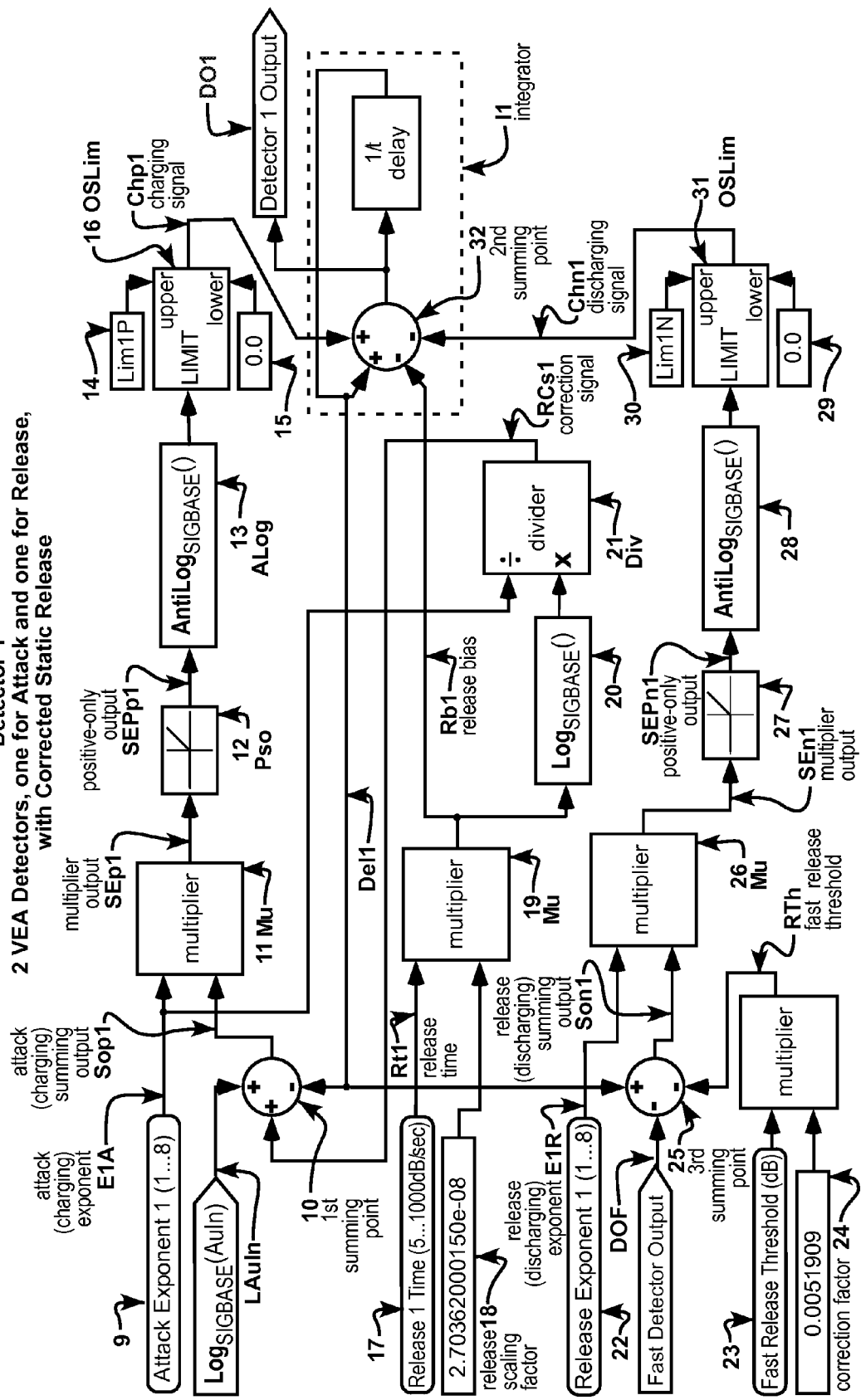
FIG. 9 shows a Detector 1 subsystem, which comprises a VEA Detector that generates an attack Control Value, a second VEA Detector that generates a release Control Value, and a static release correction.

As shown in FIG. 9, the VEA Detector subsystem, "Detector 1", has two VEA Detectors, one for attack, and one for release, and a corrected static release circuit. Each VEA Detector in the Detector 1 subsystem has an AntiLogSigBase( ) module (13 and 28). The two VEA Detectors in Detector 1 are used in concert to process an input signal (LAuIn) generated by a LogSigBase(AuIn) module from the program signal. The Detector 1 subsystem outputs a Control Value (DO1) at the Detector 1 output module. A first VEA Detector charging circuit (modules 9-16) in the Detector 1 subsystem controls the rate of charging, or "attack", of integrator (I1) in response to an increase in program signal level, and operates in the same way as the VEA Detector charging circuit (modules 102-108) described in the discussion of FIG. 6. The other VEA Detector discharging circuit (modules 25-31) in the Detector 1 subsystem operates in the same way as the discharging circuit (modules 153-164) described in the discussion of FIG. 8, and controls the rate of discharging, or "release", of integrator (I1), thereby increasing the discharge rate of Detector 1 in response to a decrease in program signal level, and can do this to a degree beyond that which is provided by the static release Control Value (Rb1). The static release Control Value (Rb1) uses the method described in connection with the VEA Detector shown in FIG. 6. In FIG. 9, the static release Control Value (Rb1) is generated by modules 17, 18, and 19. Changes in attack exponent module (9) Control Value (E1A) or in the release time module (17) Control Value (Rt1) can affect static program signals adversely, but are corrected by modules 20 and 21, as explained above.

The VEA Detector discharge signal, or release, (modules 25-31) of the Detector 1 subsystem accepts an input (DOF) from a Fast VEA Detector (see FIG. 7), and is affected by the release exponent module (22) Control Value (E1R) under manual or external process control, as described in connection with FIG. 7. The AntiLogSigBase( ) module (13) in the "attack" or charging VEA Detector charging circuit (modules 9-16) provides an adjustable, non-linear characteristic for charging ("attack") the integrator (I1) and a second Anti-LogSigBase( ) module (28) provides a "Release" characteristic for discharging (modules 22-31) the integrator (I1).

The "DC performance" of the Detector 1 subsystem is such that with an input signal of a constant DC level, the level generated by the Detector 1 subsystem output (DO1) is equal to the input (LAuIn).

The static performance of a Detector 1 subsystem is such that with an input signal of a periodic wave (e.g., sine, square, pulse, sawtooth, as well as many vocal and musical waveforms), the level generated by the Detector 1 subsystem output (DO1) is a constant DC, although fast settings of the release time Control Value (Rt1) (i.e., high dB/sec release rates) may introduce small signal artifacts.

It is the nature of the invention that neither the attack exponent 1 module Control Value (E1A) nor the release 1 time module Control Value (Rt1) has an effect on the static signal at the Detector 1 subsystem output (DO1) for sine wave signals.

The "Transient" performance" of the Detector 1 subsystem is such that with an input signal of an increasing (non-constant) level of any kind of signal, the Control Value generated by the Detector 1 subsystem output (DO1) is a representation of the change in the input signal as controlled by attack exponent 1 module (9) Control Value (E1A). It is a key feature of the design of the VEA Detector that the non-linear nature of the "attack" (or charging) path increases in speed (i.e. decreases the time that is taken to "settle" on the next static value) as the rate of change in signal level increases. These results are very desirable, novel, and unexpected.

When an input signal is removed from the LogSigBase (AuIn) module, the output, there are two mechanisms that can control the recovery ("release" or "discharge") of integrator (I1), and in turn release of the program signal from compression. First, there is a release bias Control Value (Rb1). To generate release bias Control Value (Rb1), the release 1 time module (17) and release scaling factor from module (18) are connected as inputs to multiplier (19). Multiplier (19) transforms the scale of the release time Control Value (Rt1) from dB/second to the proper internal representation and scale for use in the Detector 1 subsystem. A constant decay ("release" or "discharge") is subtracted from integrator (I1) until Control Value (Chp1) equals Control Value (Rb1). A Control Value (RCs1) is also generated from divider (21) which corrects for changes in integrator (I1) caused by changes in the attack exponent 1 Control Value (E1A) or release 1 time Control Value (Rt1). Second, there is a "program signal dependent" method for recovery ("release" or "discharge") by means of the VEA Detector fast discharge circuit (modules 22-31).

Figure 10:
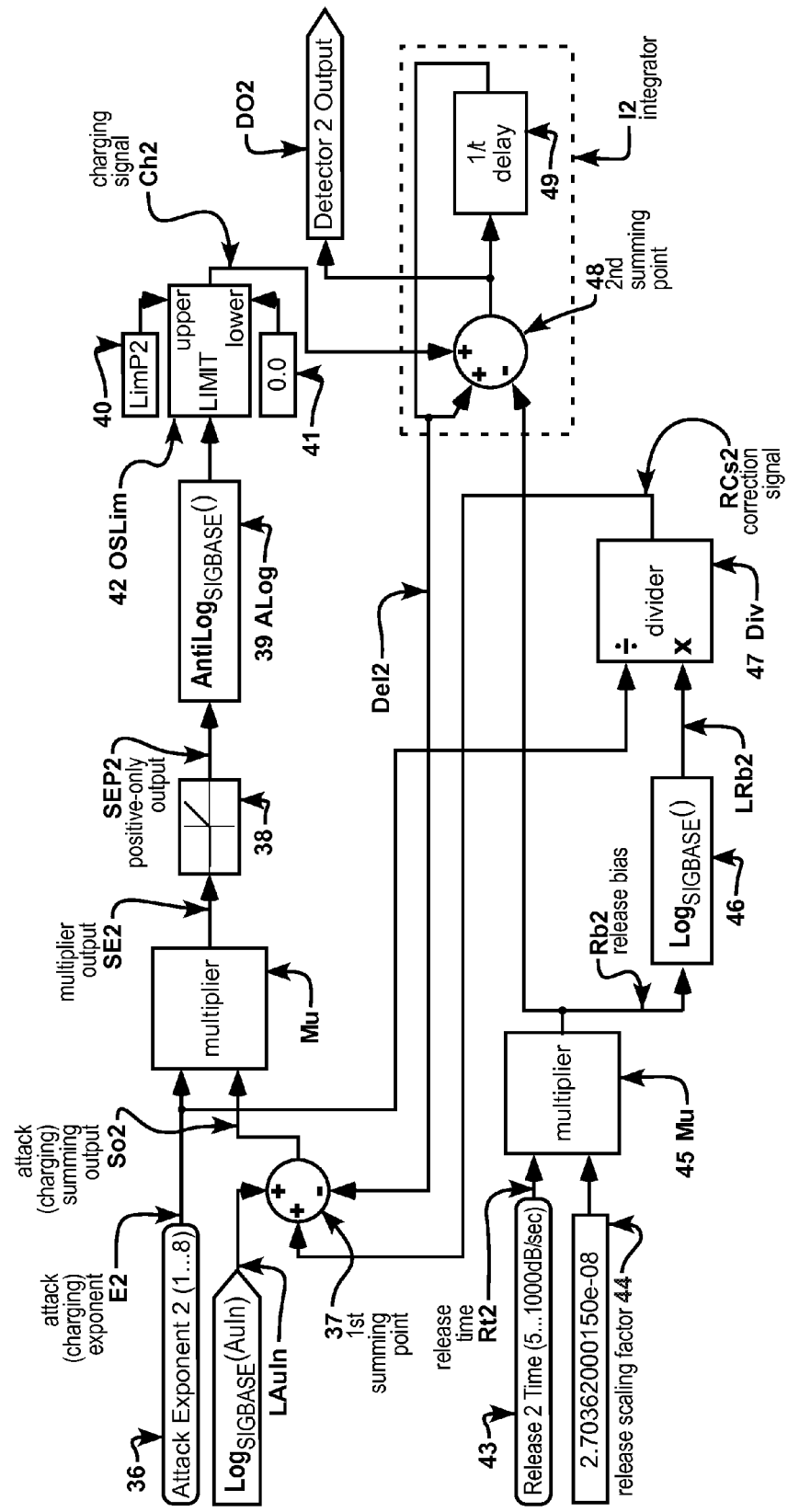
FIG. 10 shows a Detector 2 subsystem, which comprises a single VEA Detector, and a static release correction.

As shown in FIG. 10, "Detector 2", the VEA Detector subsystem has one VEA Detector charging circuit (modules 36-42) and a corrected static release circuit. The VEA Detector in the Detector 2 subsystem has an AntiLogSigBase( ) module (39). The operation of the Detector 2 subsystem is as described above for FIG. 6. The Detector 2 subsystem generates an output (DO2) in the Detector 2 output module.

The modules and interconnection of the Detector 2 subsystem (modules 36-42, 12) are the same as in the Detector 1 subsystem above, except the Detector 2 subsystem lacks a VEA Detector fast discharge circuit (modules 22-31 of FIG. 9). The Detector 2 subsystem is shown with a corrected static release circuit, modules 43-47, which provides correction Control Value (RCs2).

The DC performance of a Detector 2 subsystem is such that with a program signal input of a constant DC level, the level generated by a Detector 2 subsystem output (DO2) is equal to the input.

The static performance of Detector 2 subsystem is such that with an program signal input of a periodic wave (e.g., sine, square, pulse, sawtooth, as well as many vocal and musical waveforms), the Control Value generated by the Detector 2 subsystem (DO2) is a constant DC, albeit with some small signal artifacts for fast settings of the release time Control Value (Rt1), i.e., at high dB/sec release rates. Neither the attack exponent 2 Control Value (E2) nor the release 2 time Control Value (Rt2) has an effect on the static signal at the Detector 2 subsystem output Control Value (DO2) for sine wave signals.

The transient" performance of the Detector 2 subsystem is such that with a program signal input of an increasing (non-constant) level of any kind of signal, the output Control Value (DO2) generated by a Detector 2 subsystem is a representation of the change in the program signal input as controlled by the attack exponent 2 Control Value (E2).

The attack exponent (36) is variable, i.e., it is a selectable Control Value, and the circuit is able to provide a convergent approximation of program signal input as follows: 1) exponentiating successive signal samples to the "nth" power, 2) averaging these results of the exponentiation, and then 3) taking the "nth" root of the sum of this average. This is desirable because the perceived magnitude of the envelope of complex real-world signals does not necessarily correspond to a simple RMS measurement. These same complex real-world signals are often more likely to correspond in magnitude to a representation by a higher-power (greater than 2) exponential averaging.

When an input signal is removed from the LogSigBase (AuIn) module of the Detector 2 subsystem, a release bias Control Value (Rb2) controls the recovery. The release bias Control Value (Rb2) is generated from a release 2 time Control Value (Rt2) set in the Release 2 Time module (43) and release scaling factor from module (44), both of which are inputs to a multiplier (45); the multiplier (45) transforms the scale of the release 2 time Control Value (Rt2) in dB/second to the proper internal representation and scale for use in Detector 2 subsystem. A constant decay ("release") is subtracted from the integrator (12, comprised of modules 48 & 49) until Control Value (Ch2) equals Control Value(Rb2).

Figure 11:
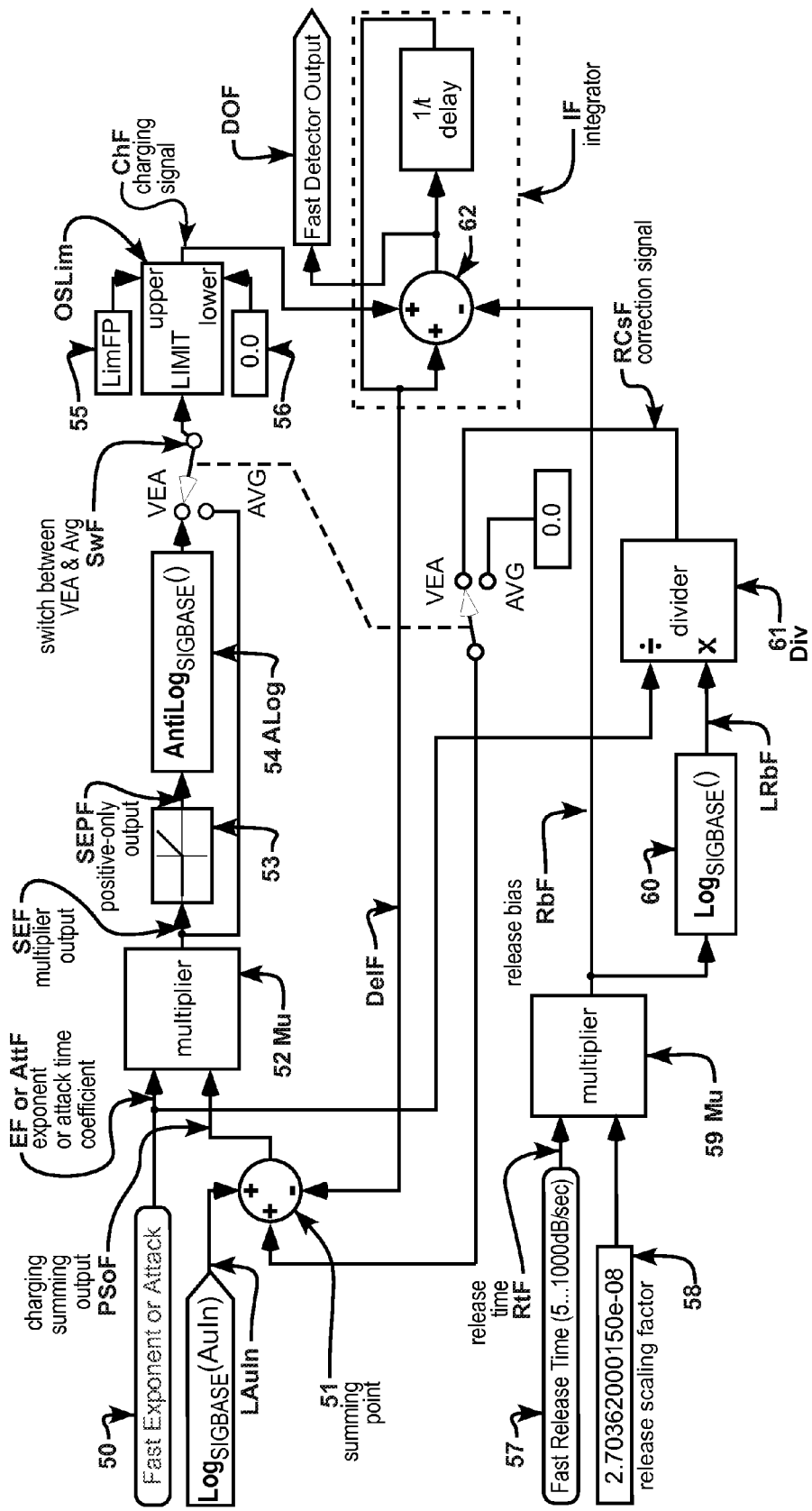
FIG. 11 shows a Fast Detector subsystem, aka Detector Fast subsystem, with a circuit switchable between VEA Detector mode and averaging mode in the log domain. A Fast Detector subsystem can be used to provide an additional input signal for Detector 1, shown in FIG. 9, to control the "release", or discharge, at a signal-dependent rate.

As shown in FIG. 11, the VEA Detector "Detector Fast" has one VEA Detector charging circuit (modules 50-56, OSLim), which controls the rate of charging, or "attack", of integrator (IF) in response to an increase in program signal level. This is switchable between VEA mode and Average (in the log domain) mode, as described above in connection with, and shown in, FIG. 7; the Detector Fast subsystem also has a corrected static release circuit (modules 57-61). The Detector Fast subsystem determines conditions under which one or more of the other VEA Detectors can be affected by a much faster time-constant.

Typically, for instance, when a Detector 1 subsystem is used in a VEA DRC (as show in FIG. 12), the user-selectable or external-process-selectable Control Values of a Detector 1 subsystem are set to a "slow" time-constant (i.e., with reference to FIG. 9, lower values are set for attack exponent (E1A) and higher values are set for release 1 Time (Rt1), which settings improve the dynamic handling of complex, time-varying signals over a longer period of time, i.e., on the order of seconds.

Figure 12:
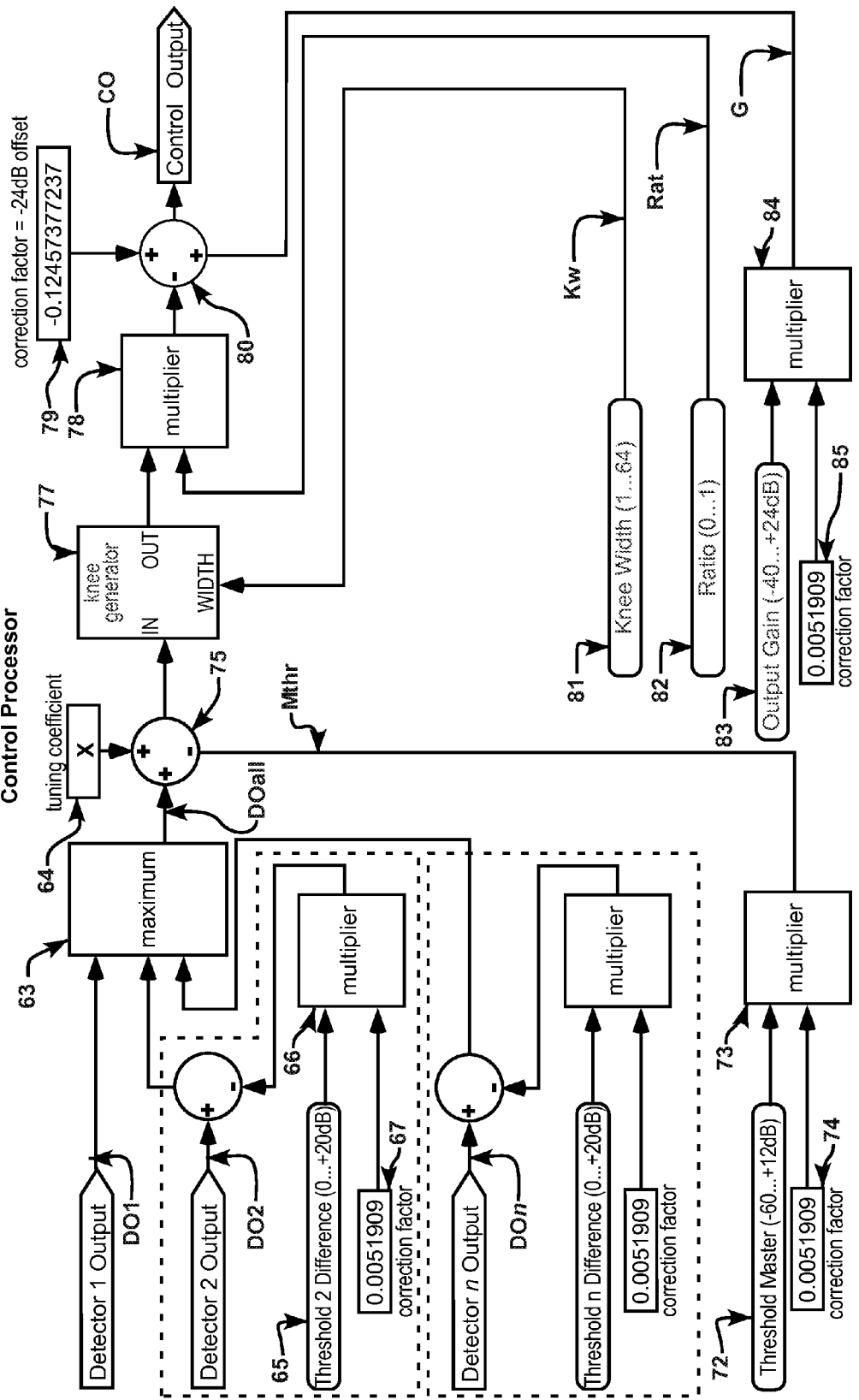
FIG. 12 shows how multiple VEA Detector subsystems and selectable Control Value modules are combined in one configuration of a VEA DRC Control Processor. This configuration differentiates between the control signals from various VEA Detector subsystems, assigns a priority to each VEA Detector subsystem output Control Value, and processes the selected VEA Detector subsystem output Control Value outputs into a Control Processor Control Output.

Typically, for instance, when a Detector 2 subsystem is used in a VEA DRC (as shown in FIG. 12), the user-selectable or external-process-selectable Control Values of a Detector 2 subsystem are set to a "fast" time-constant, sensing a narrower time window, on the order of 100-500 milliseconds or less.

Typically, for instance, when a Fast Detector subsystem is used in a VEA DRC (as shown in FIG. 12), the user-selectable or external-process selectable Control Values of a Fast Detector system are set faster than the user-selectable or external-process-selectable Control Values of a Detector 2 subsystem.

The Fast Detector subsystem of FIG. 11 ordinarily interfaces with a Detector 1 subsystem through the Fast Detector output module feeding the third summing point (25) as shown in FIG. 9. Its purpose is to make a much faster determination of the immediate signal level in order to provide the bidirectional (i.e., attacking and releasing) Detector 1 subsystem with a "smoothed" signal. It can be selected as either a VEA Detector or an average-responding detector using switch (SwF).

A VEA Detector is a collection of modules as described above and is a required element in a VEA DRC, but can also be used in devices other than a VEA DRC (as described below). One or more VEA Detectors each generate a Control Value that corresponds to the envelope of the LAuIn program signal.

As shown in FIG. 12, when VEA Detector subsystems are used in a VEA DRC, the detector output of each VEA Detector subsystem preferably feeds a "Control Processor", which is a series of modules that compare and prioritize (aka weight) the Control Value from each VEA Detector subsystem connected to the Control Processor, and can optionally adjust the Control Value from a selected VEA Detector subsystem using tuning coefficients, knee generators, and correction factors, and outputs a DCA Control Value (CO). A Control Processor typically has an Control Processor output gain module (83-85).

The combination of one or more VEA Detector subsystems and Control Processor is called a "VEA Processor". A VEA DRC comprises a VEA Processor and an DCA (or other process controlled by the VEA Processor), and may include external processes as described above.

A VEA DRC is typically controlled by one or more VEA Detector VEA subsystems, as described above, whose controls are set to different sensitivities and response times (e.g., attack and release settings), and also by static and dynamic control coefficients, as described below. In a minimum embodiment, a VEA DRC consists of a single VEA Detector, with the manual controls described above, and a DCA. A VEA DRC imposes a non-linear, signal-level-dependent gain (or loss) profile to a program signal by controlling a DCA through which the program signal passes. As a function of static and dynamic Control Values, the VEA DRC output Control Value (CO) can (a) reduce the gain for large program signal inputs using a low compression ratio (i.e., the ratio of gain reduction in dB of the output signal, above a program signal threshold value, of a DCA controlled by a VEA DRC compared with the input program signal); the compression ratio is a selectable Control Value using ratio module (82), which drives multiplier(78) in FIG. 12, to yield a "compressor", or (b) can "brickwall" the program signal using a very high compression ratio (using modules 82 and 78 in FIG. 12) at a high program signal threshold value to yield a "limiter", or (c) can reduce the gain for low program signal inputs and pass large program signal input above a given threshold to yield a "gate" using threshold Control Values, or (d) can increase the gain of low program signal inputs but not of large program signal inputs to yield an "expander" or "upward compressor", or (e) can decrease the gain of low program signal inputs but not of large program signal inputs to yield a "downward expander", aka "noise suppressor". The preceding actions (a) to e) can be implemented in uni-band or multi-band configurations, either standalone or combined in a single process or device. Configurations for (e) are particularly useful in restoration of film and audio archival recordings.

FIG. 12 shows a Control Processor that evaluates the outputs of a Detector 1 subsystem (see FIG. 9), a Detector 2 subsystem (see FIG. 10), as well as the outputs (DOn) of other VEA Detector subsystems or prior art detectors (not shown). The output of a Detector 1 subsystem goes directly into a maximum module (63). The maximum module (63) is a comparator that selects the input with the highest instantaneous Control Value and passes through only that highest Control Value to an adding input of a primary summing point (75). The degree to which the maximum module (63) allows the output (DO2) from a Detector 2 subsystem to override the output (DO1) from a Detector 1 subsystem may be set by an external process (not shown) or by manual selection of a Control Value from the Threshold 2 Difference module (65), which is typically calibrated in dB relative to the signal level and scaled in multiplier (66) by module (67), which provides a correction factor. In this example, the Threshold 2 Difference module (65) adjusts the degree to which the Detector 2 subsystem output (DO2) has to exceed (become more positive) than the Detector 1 subsystem output (DO1) in order for the DO2 Control Value to become the output (DOall) of maximum module (63).

The outputs (DOn) of other detectors can also prevail over Control Values (DO1) and (DO2) in the same fashion as described above for Control Value (DO2) prevailing over Control Value (DO1). The maximum module selects the highest instantaneous value of all Control Values at its input and outputs the highest input Control Value as output Control Value (DOall). The output Control Value (DOall) of maximum module (63) is connected to an adding input of primary summing point (75).

In addition, a threshold master module (72) outputs a Control Value calibrated in dB, and converted to internal scaling by multiplier (73) and correction factor (74) to provide Control Value (Mthr). The threshold master Control Value (Mthr)) is connected to a subtracting input of primary summing point (75) and increases (or decreases) the sensitivity of primary summing point (75) to the output (DOall) of maximum module (63). The Control Value generated by tuning coefficient module (64) is connected to an adding input of primary summing point (75). The tuning coefficient also increases (or decreases) the sensitivity of primary summing point (75) to the output (DOall) of maximum module (63).

Figure 15A:
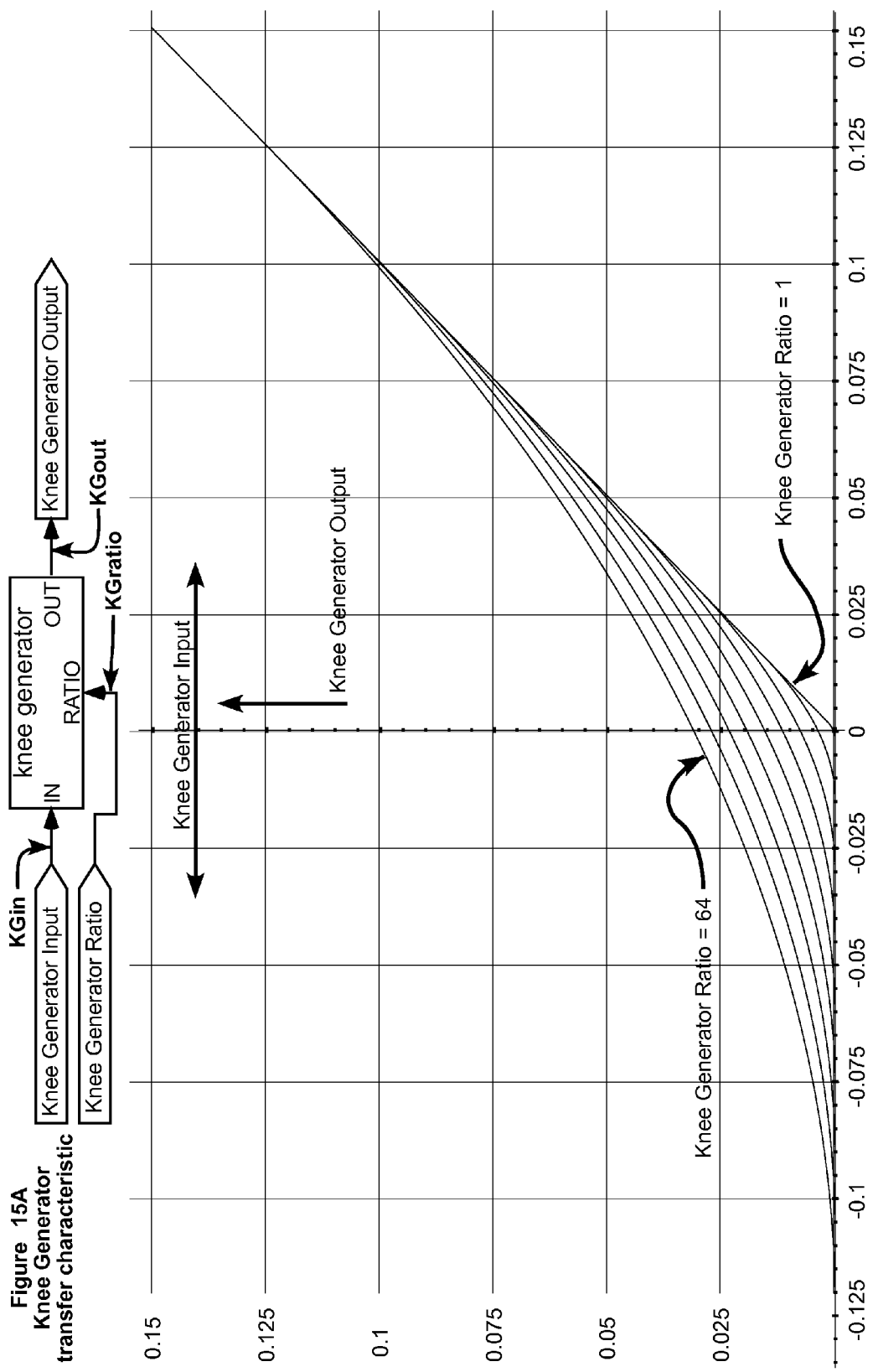
FIG. 15A shows a typical "knee generator" and typical transfer characteristics of a knee generator.

The output of primary summing point (75) is connected to the input of a knee generator module (77). Knee generator module (77) generates a "knee" of variable sharpness in response to a Control Value selected by a knee width module (81) and is connected to the width input of knee generator (77). The transfer characteristics of knee generator module (77) are shown in FIG. 15A. The knee generator module (77) generates only positive Control Values. "Knees" are well known in the art of program signal compression. A VEA DRC can use one or more knee generator modules to generate knees at one or more levels within the dynamic range of a program signal. In signal processing that uses both compression and limiting, a first knee is used for the onset of compression and a second knee is used for the onset of limiting.

The output of the knee generator module (77) is connected to an input of multiplier (78). A selected Control Value generated by ratio module (82) is connected to a second input of multiplier (78). The output of multiplier (78) is connected to a subtracting input of the correction summing point (80). A selectable Control Value generated by output gain module (83) is connected to a first input of multiplier (84), and a correction factor of 0.0051909 (85), is connected to a second input of multiplier (84). The output (G) of multiplier (84) is connected to an adding input of correction summing point (80). A correction factor selected in correction factor module (79) for the expected dynamic range, typically negative 0.12457377237 for an offset of −24 dB, is connected to a second adding input of correction summing point (80). The output Control Value (CO) of correction summing point (80) is the output of the Control Processor shown in FIG. 12.

In a preferred embodiment, a Detector 1 subsystem output Control Value, a Detector 2 subsystem output Control Value, and optionally "n" other detector output Control Value(s) are used in various combinations to impose a non-linear, signal-dynamic dependent gain profile on the program signal being processed by a VEA DRC (e.g., reducing the gain for increasing signal levels, generally known as "compressing" if non-asymptotic or "limiting" if asymptotic; increasing the gain for decreasing signal levels, generally known as "expanding"; and "gating" or "downward expansion" for signal levels above or below a threshold level, respectively).

Figure 13:
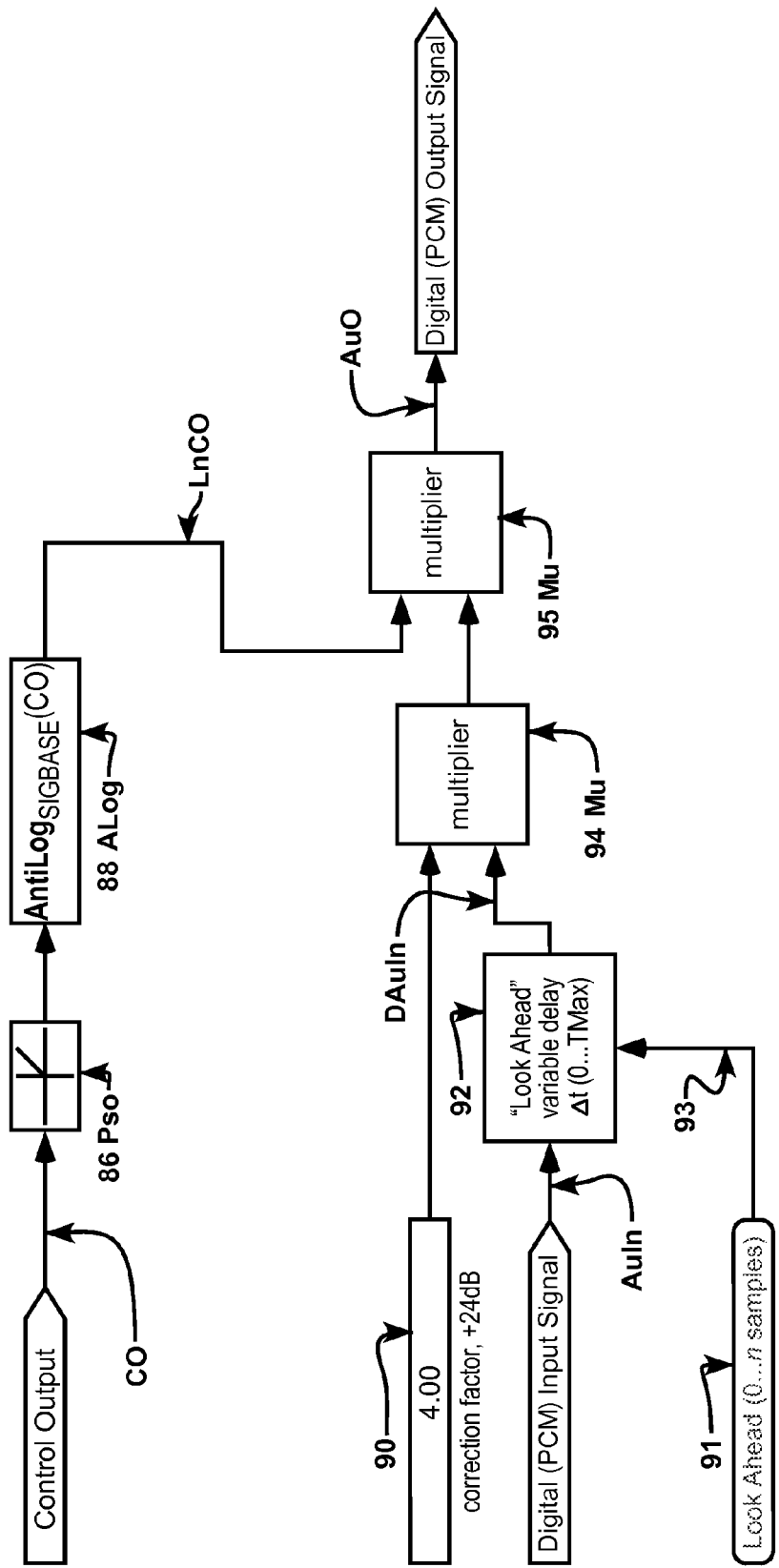
FIG. 13 shows the signal processing of a VEA DRC embodiment with a look ahead delay and correction factor.

FIG. 13 shows an embodiment of a VEA DRC that processes a program signal using a Control Value (CO) from a VEA Control Processor (or, in the simplest case, from a single VEA Detector). The Control Value (CO) is limited to a range of 1.0 in the positive direction and 0.0 in the negative direction by overshoot limit module (86). This signal is then converted to the linear domain by an AntiLogSigBase module (88), the output of which (LnCO) is connected to an input of a first multiplier (95). The base domain, digital program signal input (AuIn) is passed through a variable digital delay module (92) that is connected to an input of a second multiplier (94). This digital delay can be from 0 to N samples of delay (93), as set by the "Look Ahead" module (91). This allows the Control Value (LnCO) from the AntiLogSigBase(CO) module (88) to arrive at the first multiplier (95) slightly in advance of the program signal itself, reducing "attack artifacts". The delayed program signal (DAuIn) is multiplied by a selectable Control Value generated in a correction factor module (90), in the case shown in FIG. 13, a factor of 4.0 (which raises the signal by +24.0 dB) to give the VEA DRC the ability to increase as well as to reduce gain. Note the −24 dB correction factor applied by correction factor module (79) to the correction summing point (80) in the Control Processor shown in FIG. 12. Typically, the correction factor applied by correction factor module (79) to the correction summing point (80) in the Control Processor is typically equal in dB but opposite in sign of the correction factor applied by correction factor (90) in FIG. 13. The Control Value generated in a correction factor module (90) is connected to a second input of the second multiplier (94). The output of multiplier (94) is connected to an input of the first multiplier (95). The program signal output (AuO) is the output of the first multiplier (95) and is the same base domain digital format as the program signal input (AuIn). In the VEA DRC gain control circuit shown in FIG. 13, the output of multiplier (95) is a base domain digital program signal (in the example in FIG. 13, a PCM audio signal). Multiplier (95) is a DCA.

Figure 14:
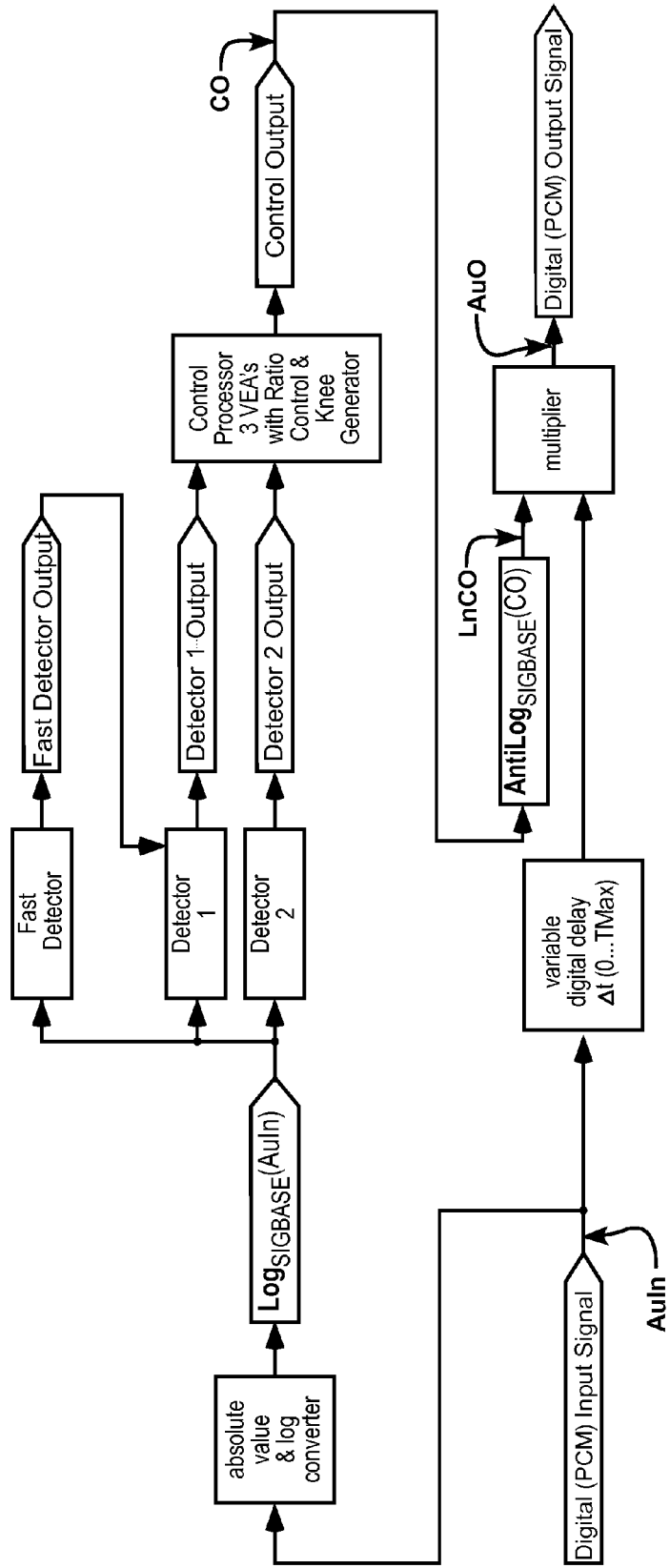
FIG. 14 shows a preferred embodiment of a VEA DRC with three VEA Detector subsystems.

FIG. 14 shows a block diagram of a complete VEA DRC. A program signal input in digital (PCM) format is converted to absolute value, converted to the logarithmic domain by the LogSigBase(AuIn) module, and then evaluated (detected) by one or more VEA Detectors or VEA Detector subsystems. In the example shown in FIG. 14, the detection is by a Fast Detector subsystem, a Detector 1 subsystem, and a Detector 2 subsystem, as described above. The Control Value outputs of the three Detector subsystems are fed into a Control Processor, which allows for manual and/or automatic (i.e., by an external process) evaluation of incoming signals, as described above, and the determination of which Detector output Control Values and how much of the selected Detector output Control Values are used to control a DCA. The Control Processor control output module outputs a Control Value (CO) that is converted to the base domain by an AntiLogSigBase(CO) module, the output of which (LnCO) is one input to a multiplier. The delayed base domain program signal is a second input to the multiplier. The output of the multiplier is a base domain digital program signal (in the example in FIG. 14, a PCM audio signal).

In summary, FIG. 14 shows a preferred embodiment of a VEA DRC that comprises one or more VEA Detectors in three Detector subsystems, the maximum of which outputs is selected as the Control Value, as shown in FIG. 12. The Control Value is then shaped by a knee generator and ratio control, converted to an antilog signal, and fed into an input of a multiplier (a DCA). The input program signal is fed to (i) the one or more Detector subsystems and (ii) through a variable delay, which delay is equal to the processing time required to generate the Control Value, and then into a second input of the DCA. The output of the DCA is processed program signal.

FIG. 15A shows the knee generator circuit, which is used in the Control Processor shown in FIG. 12, and its transfer characteristics. There are two inputs to the knee generator module: knee generator input (KGin) and knee generator ratio (KGratio), and one output: knee generator output (KGout). Note the first equation in FIG. 15B shows that KGw equals 512 divided by KGratio, where KGratio is user-selectable (e.g., unity, 8, or a multiple of 8). The mathematical relationship between the inputs and the knee generator module output is shown in FIG. 15B (where the question marks reflect their use in programming in the C, C++, and ObjectiveC languages).

Two additional embodiments of a VEA DRC are an upward expander and a downward expander. Upward expansion is the inverse of compression; an expander increases the gain of a processor when the program signal input drops below a selected threshold. Downward expansion reduces the gain of a processor when the program signal input drops below a selected threshold.

Figure 16:
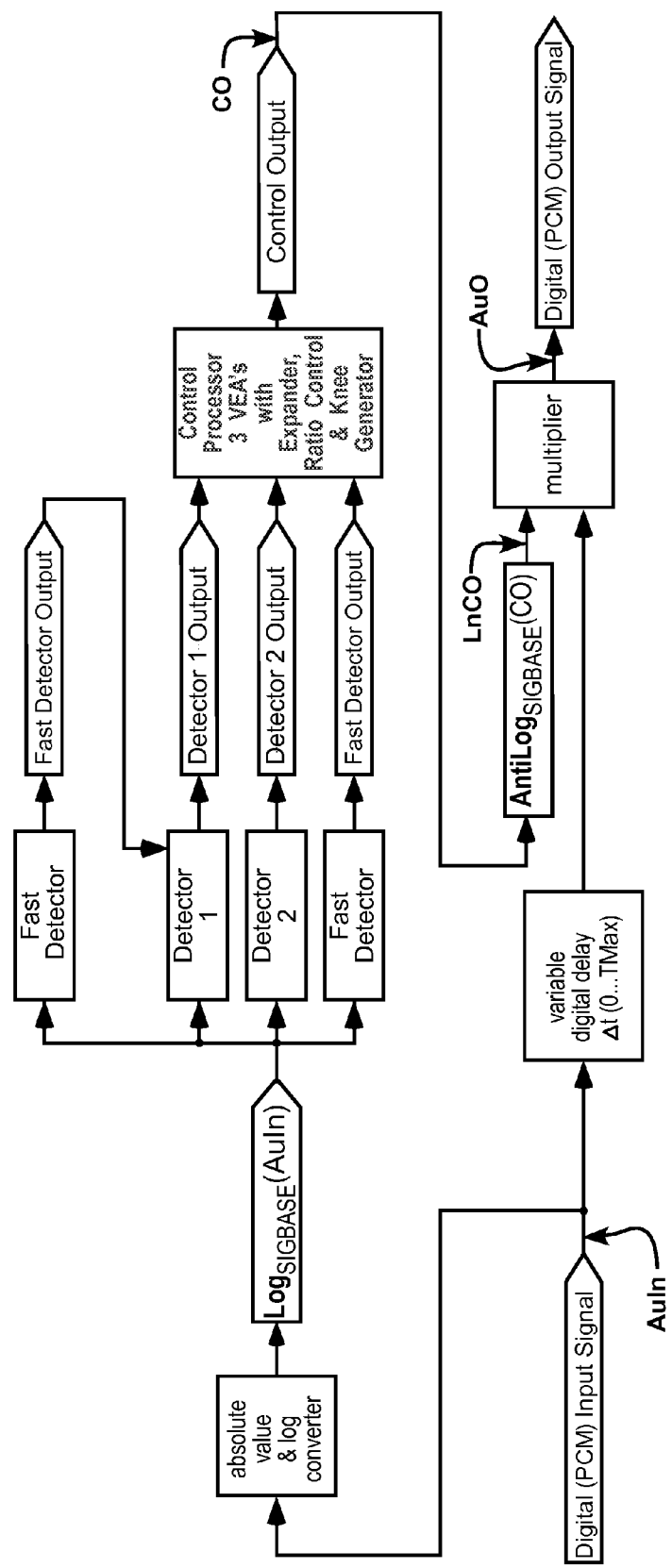
FIG. 16 shows a preferred embodiment of a VEA DRC with a Detector 1 subsystem with charging and discharging VEA Detectors, a Detector 2 subsystem with one VEA Detector with corrected Static Release, a Fast Detector subsystem switchable between VEA Detector and average responding detector, and a Control Processor with ratio control, knee generator, and an expander.
Figure 17B:
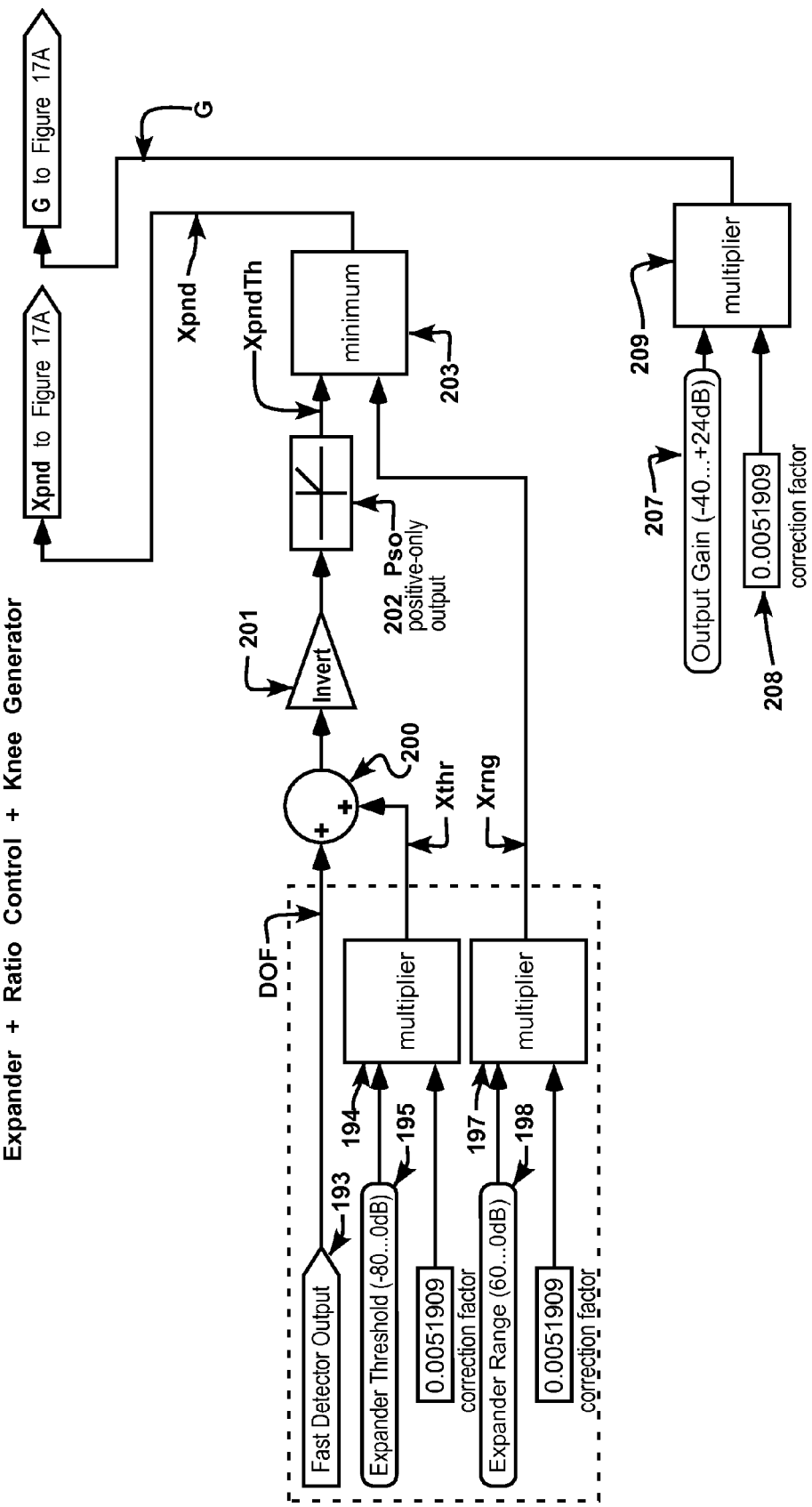

FIG. 16 shows an embodiment of a VEA DRC configured for use as an upward expander and that uses the Control Processor shown in FIGS. 17A and 17B. The VEA DRC shown in FIG. 16 has the same elements and operation as the VEA DRC shown in FIG. 14, except the Control Processor includes an expander circuit (modules 193 to 206 of FIGS. 17A and 17B).

As shown in FIGS. 17A and 17B, an upward expander embodiment of a VEA DRC uses a modification of the Control Processor of FIG. 14. The upward expansion of program signal is driven by a fast detector control value (DOF) from a Fast Detector subsystem (see FIGS. 7 and 11). The Control Values selectable by the expander range module (198) and by the expander threshold module (195) are scaled to the internal dB representation of the circuit by multipliers (197) and (194), respectively, which apply a correction factor of 0.0051909. The Fast Detector output Control Value (DOF) and the expander threshold module (195) Control Value (Xthr) are each connected to an adding input, respectively, in the expander summing point (200); the Control Value (Xthr), a zero to negative-value signal, and the Fast Detector Output (DOF) are added together in expander summing point (200) and then sign-inverted by the inverter (201). As a result of sign inversion, as the Fast Detector subsystem output Control Value (DOF) diminishes, the output of the expander summing point (200) increases. The expander threshold Control Value (Xthr) is chosen such that above the threshold value, the output of the expander summing point goes positive, and Control Value (XPndTh) is positive. The output of inverter module (201) is the input to positive-signal-only module (202). Negative signals at the input of the positive-only module (202) are not passed to its output, Control Value (XpndTh). The output of positive-signal-only module (202) is one input to a minimum comparator module (203), and the output of multiplier (197) is a second input to minimum comparator module (203). The minimum comparator module (203) outputs either Control Value (XpndTh) or Control Value (Xrng), whichever is the most negative input. Thus, if the expander range module (198) Control Value is set to "0 dB", then the resulting Control Value (Xrng) is zero, and thus Control Value (Xpnd) is also zero for all values of the Fast Detector subsystem output. Setting the expander range Control Value (Xrng) to a positive value limits the total range of the expansion, and if the Control Value (XpndTh) goes less positive than Control Value (Xrng), the Control Value (XpndTh) becomes the output Control Value (Xpnd) of minimum comparator module (203) and controls the gain reduction at the control output module of the Control Processor (i.e., the Control Value (Xpnd) drives, through intermediate modules (206) and (211), the Control Processor output Control Value (CO)).

Figure 18:
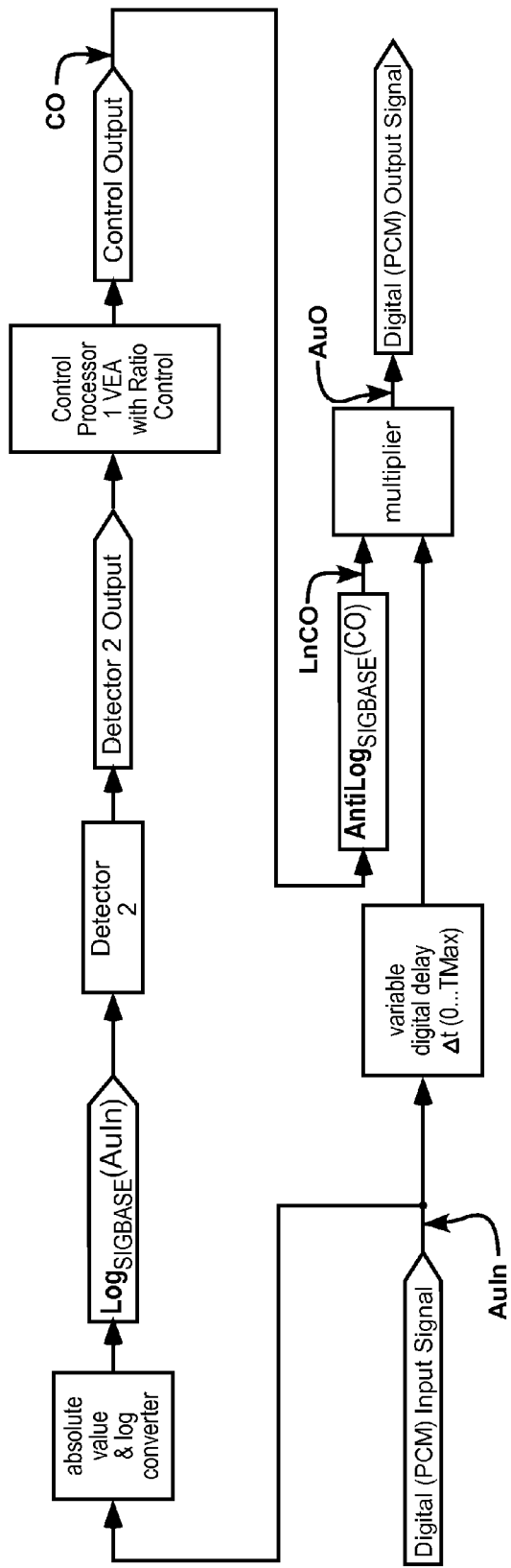
FIG. 18 shows a VEA DRC with 1 VEA Detector and a Control Processor with ratio control.
Figure 19:
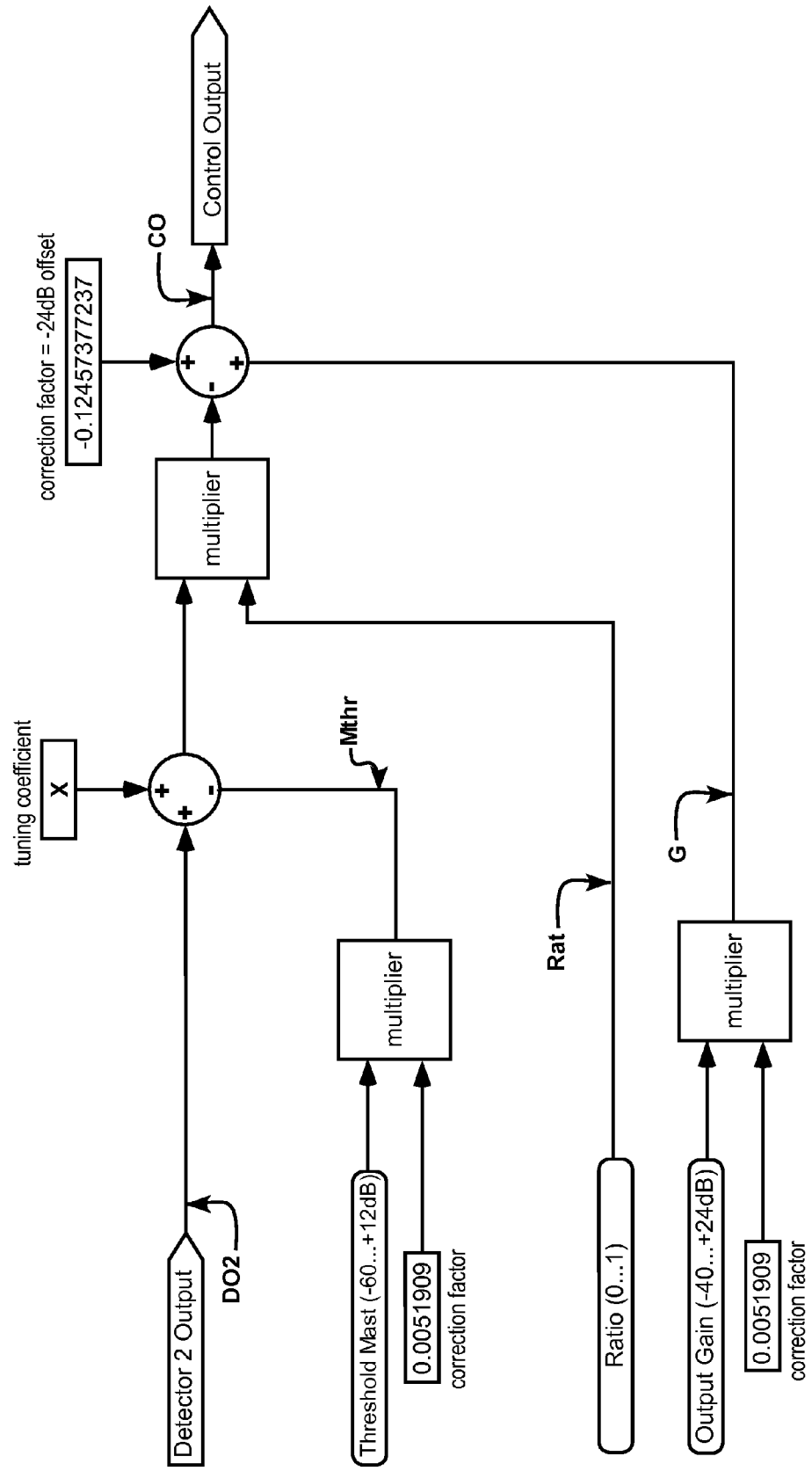
FIG. 19 shows a detailed view of the Control Processor in FIG. 18.

FIG. 18 shows a preferred embodiment of a VEA DRC with one Detector 2 subsystem, with ratio control. Its Control Processor is shown in FIG. 19. Operation of the system shown in FIG. 18 is as described above for the circuits shown.

FIG. 19 shows the Control Processor for a VEA DRC of FIG. 18, with one Detector 2 subsystem, with ratio control. Operation of the system shown in FIG. 19 is as described above for the circuits shown.

Figure 20:
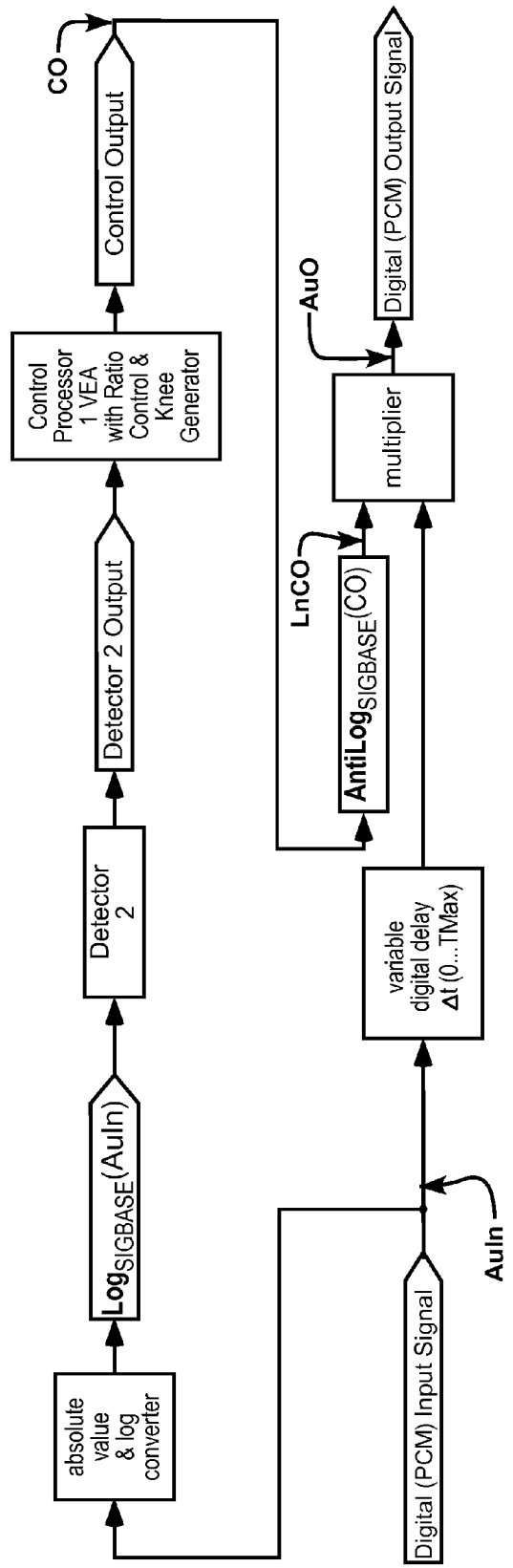
FIG. 20 shows a VEA DRC with 1 VEA Detector and a Control Processor with ratio control and a knee generator.

FIG. 20 shows a preferred embodiment of a VEA DRC with one Detector 2 subsystem, ratio control, and a knee generator. Its Control Processor is shown in FIG. 19. Operation of the system shown in FIG. 20 is as described above for the circuits shown.

FIG. 21 shows the Control Processor for a VEA DRC of FIG. 20, with one Detector 2 subsystem, ratio control, and a knee generator. Operation of the system shown in FIG. 21 is as described above for the circuits shown.

FIG. 22 shows a basic embodiment of a VEA DRC in which a program signal with dynamic range is controlled by the VEA DRC so that the dynamic range of the output signal is more appropriate to the distribution system. Exemplary embodiments and uses include an expander circuit for specific processing of low level inputs. Sources may be real time or previously stored, including (but not limited to) audio signals, video signals, RF signals, data streams, output from sensors of any type. Control Values can include presets, user adjustable parameters, and automatic adjustments. Distribution may include electronic storage, amplifiers and speakers, headphones, video displays, encoding systems, transfer to further processing systems, transmission and broadcast systems of any type.

FIG. 23 shows a basic audio embodiment of a VEA DRC in which a live or recorded audio signals, individually or in groups, whether as a part of a combined audio and video signal or separately, are dynamically controlled. Exemplary embodiments and uses include: live audio performance, recording of live or previously stored signals, professional audio mixing for broadcast television, radio, film and video, encoding for personal listening devices, hearing aids, computers, mobile phones, airplane, train or automotive radio and entertainment devices, airline, train, subway announce systems, workplace and private, commercial or public safety distributed speaker systems, consumer playback systems, commercial playback systems, background music in a commercial or office environment, radio or television broadcast (whether over the air, satellite, cable, or networked), preprocessing prior to data compression, format transcode or transcodec processing, personal playback devices including portable and stationary entertainment systems.

FIG. 24 shows a basic video embodiment. In this embodiment, a VEA DRC controls the dynamic range of live or recorded video signals, individually or in groups, whether as a part of a combined audio and video signal or separately. Exemplary embodiments and uses include: processing within a video monitor or projector for controlled luminance and gamma, processing within a video camera, computers, security system with switched input from many sources, transferring among image formats, transcode or transcodec processing, pre-processing prior to data compression, transferring from film scanner to video, cable, internet, and broadcast transmission systems, consumer home video displays and entertainment systems, public and outdoor video displays, automotive, airplane, subway, or train radio and entertainment devices; airline, train, subway announce systems; airplane playback systems; workplace and private, commercial or public safety distributed video systems, consumer home or commercial entertainment systems; personal playback devices including portable and stationary entertainment systems.

FIG. 25 shows a basic sensor embodiment. In this embodiment, a VEA DRC controls the dynamic range of flow or process sensor where sensor output dynamic range exceeds dynamic range of an external controller or storage input. Exemplary embodiments and uses include chromatographs, pressure sensors, optical sensors, strain gauge outputs, or transducers.

FIG. 26 shows a basic measurement embodiment. In this embodiment, the level of a source signal with dynamic range is measured by the VEA Detector and passed directly to the output, with no DRC. Exemplary embodiments and uses may be real time or previously stored, including (but not limited to) audio signals, video signals, RF signals, output from sensors of any type. Controlling Parameters may include presets, user adjustable parameters, metadata, steering data, and automatic adjustments. Distribution may include electronic storage, displays of any type, reproducers or transducers, encoding systems, transfer to further control and processing systems, transmission and broadcast systems of any type.

FIG. 27 shows a multiple thread measurement for comparison and pattern matching. In this embodiment, the levels of several program signals with dynamic range are measured by the VEA Detectors. Exemplary embodiments and uses include the measured results, as well as the dynamically controlled "normalized" outputs, and the Control Data as metadata. With the identical Control Data to all DRCs, the Normalized Outputs maintain their relationship over a wide dynamic range. Sources might include sensors of any type, from flow sensors, chromatograph and spectrum analyzer data points, to financial data streams, to multi-channel audio streams. Examples would include auto recognition of patterns within the incoming data, regulating flow processes based on desired outcomes such as chemical mix, production results, energy consumption, and battery life.

FIG. 28 shows an ambient noise embodiment for audio. This embodiment incorporates a VEA DRC to control a signal path, and an additional VEA Detector, fed by ambient audio sensor, to measure ambient environmental noise. Control Values from the additional VEA Detector are included in the parameters so that audio program signal output will be a) maintained at a desired level in relation to the ambient environment, and b) dynamically controlled so that the dynamic range of the output signal is appropriate to the distribution system. Exemplary embodiments and uses include: live audio performance, recording of live or previously stored signals, professional audio mixing for broadcast television, radio, film and video, encoding for personal listening devices, hearing aids, computers, mobile phones, airplane, train or automotive radio and entertainment devices, airline, train, subway announce systems, workplace and private, commercial or public safety distributed speaker systems, consumer playback systems, commercial playback systems, background music in a commercial or office environment, radio or television broadcast (whether over the air, satellite, cable, or networked), pre-processing prior to data compression, format transcode or transcodec processing, personal playback devices including portable and stationary entertainment systems.

FIG. 29 shows an ambient noise embodiment for video program signals. Expanded from Basic FIG. 22 and FIG. 24, this embodiment incorporates a VEA DRC to control signal path, and an additional VEA Detector, fed by ambient light sensor, to measure ambient environmental illumination. Control signals from the additional VEA Detector are included in parameters so that video program signal output will be a) maintained at a desired level in relation to the ambient environment, and b) dynamically controlled so that the dynamic range of the output signal is appropriate to the distribution system. Exemplary embodiments and uses include: processing within a video monitor or projector for controlled luminance and gamma, processing within a video camera, computers, security system with switched input from many sources, transferring among image formats, transcode or transcodec processing, pre-processing prior to data compression, transferring from film scanner to video, cable, internet, and broadcast transmission systems, consumer home video displays and entertainment systems, public and outdoor video displays, automotive, airplane, subway, or train radio and entertainment devices; airline, train, subway announce systems; airplane playback systems; workplace and private, commercial or public safety distributed video systems, consumer home or commercial entertainment systems; personal playback devices including portable and stationary entertainment systems.

FIG. 30 shows multi-band processing of audio as in FIGS. 22 and 23, expanded to provide additional control in complicated signals. The Source signal is separated into individual bands 1, 2, . . . n and each band is processed separately. The results are combined in a summing device, and the summed result may be additionally processed using a VEA DRC. Exemplary embodiments and uses may include: live audio performance, recording of live or previously stored signals, professional audio mixing for broadcast television, radio, film and video, encoding for personal listening devices, hearing aids, computers, mobile phones, airplane, train or automotive radio and entertainment devices, airline, train, subway announce systems, workplace and private, commercial or public safety distributed speaker systems, consumer playback systems, commercial playback systems, background music in a commercial or office environment, radio or television broadcast (whether over the air, satellite, cable, or networked), pre-processing prior to data compression, format transcode or transcodec processing, personal playback devices including portable and stationary entertainment systems. In configurations for noise reduction of live or recorded program signal, the VEA DRC detects the wanted signal above a threshold value compared to the detected noise floor within a single frequency band or within multiple frequency bands. Within a given band, the absence of desired program triggers a downward expansion. This can be real time or non-real time. Multiband processing can include compression, limiting, downward expansion, upward expansion, or gating in each band.

FIG. 31 shows a multi-thread embodiment for video uses, but expanded to provide separate processing of chrominance and luminance in a video signal. Exemplary embodiments and uses include: processing within a video monitor or projector for controlled luminance and gamma, processing within a video camera, computers, security system with switched input from many sources, transferring among image formats, transcode or transcodec processing, pre-processing prior to data compression, transferring from film scanner to video, cable, internet, and broadcast transmission systems, consumer home video displays and entertainment systems, public and outdoor video displays, automotive, airplane, subway, or train radio and entertainment devices; airline, train, subway announce systems; airplane playback systems; workplace and private, commercial or public safety distributed video systems, consumer home or commercial entertainment systems; personal playback devices including portable and stationary entertainment systems.

FIG. 32 shows a multi-thread embodiment for video pickup sensors, individual sensors or processing threads. Exemplary embodiments and uses include: video cameras with multiple sensors, image scans from film scanners, color correction of stored and live images (including print and pre-press applications where the separated input threads might be seen as color separations), processing within a video monitor or projector for controlled luminance and gamma, processing within a video camera, computers, security system with switched input from many sources, transferring among image formats, transcode or transcodec processing, pre-processing prior to data compression, transferring from film scanner to video, cable, internet, and broadcast transmission systems, consumer home video displays and entertainment systems, public and outdoor video displays, automotive, airplane, subway, or train radio and entertainment devices; airline, train, subway announce systems; airplane playback systems; workplace and private, commercial or public safety distributed display systems, consumer home or commercial entertainment systems; personal playback devices including portable and stationary entertainment systems.

In summary, a VEA Detector improves the determination of average signal level of an audio program signal as perceived by the human ear, and determination of average signal level of a displayed video program signal as perceived by the human eye, and better uses the dynamic characteristics of a given program input signal to automatically control the dynamic range of the program signal. The basic embodiment of a VEA DRC has one VEA Detector and one DCA.

A VEA DRC improves dynamic control of a broad range of program signals, such as the audio in music, dialog, sound effects, and mixed combinations of these through improved "attack" (the response to increasing signal level) and "release" (the response to decreasing signal level) characteristics.

The VEA DRC is particularly useful in pre-processing program signals before data compression is applied. By better controlling dynamic changes, fewer artifacts are produced during data compression, and data compression is more efficient.

While the preferred embodiments of the invention have been illustrated and described, as noted above, many changes can be made without departing from the spirit and scope of the invention. Accordingly, the scope of the invention is not limited by the disclosure of the preferred embodiments. Instead, the invention should be determined by reference to the claims that follow.

I claim:

1. A method for processing a base signal in a dynamic range controller comprising:
   taking a logarithm of said base signal to produce a logarithmed signal;
   subtracting a time-delayed signal provided by an integrator from said logarithmed signal to produce a modified logarithmed signal;
   multiplying said modified logarithmed signal by an exponent to produce an effectively-exponentiated logarithmed signal;
   taking an antilogarithm of a first intermediate signal derived from said effectively-exponentiated logarithmed signal to produce an anti-log signal; and
   adding in said integrator a second intermediate signal derived from said anti-log signal to said time-delayed signal to produce an output signal, said time-delayed signal being a time-delayed version of said output signal.

2. The method of claim 1 wherein said output signal is delayed by a sample time to produce said time-delayed signal.

3. The method of claim 1 wherein said output signal is a control value for processing said base signal.

4. The method of claim 1 wherein said output signal is a control value for controlling a dynamic range of said base signal.

5. The method of claim 1 wherein said first intermediate signal is produced by rectifying said effectively-exponentiated logarithmed signal.

6. The method of claim 1 wherein said second intermediate signal is an overshoot-limited version of said anti-log signal.

7. The method of claim 6 wherein said overshoot-limited version of said anti-log signal has an upper magnitude limit and a lower magnitude limit.

8. The method of claim 1 wherein said second intermediate signal is said anti-log signal.

9. The method of claim 1 wherein production of said output signal further includes a subtraction of a release bias from the sum of said second intermediate signal and said time-delayed signal.

10. The method of claim 9 wherein production of said modified logarithmed signal further includes an addition of a correction signal to the difference of said logarithmed signal and said time-delayed signal.

11. The method of claim 10 wherein said correction signal is derived from a logarithm of said release bias.

12. The method of claim 10 wherein said correction signal is derived from a logarithm of said release bias divided by said exponent.

13. The method of claim 1 wherein said adding of said second intermediate signal and said time-delayed signal provides integration in said integrator.

14. The method of claim 1 wherein said logarithmed signal is a logarithm of an absolute value of said base signal.

15. The method of claim 1 wherein said output signal converges to a root-mean-E average of said base signal where E is said exponent.

16. The method of claim 15 wherein said root-mean-E average is an average provided by taking a mean of values of said base signal taken to an Eth power and taking an Eth root of said mean.

17. The method of claim 16 wherein said exponent has a value of two and said output signal is a convergent approximation to a root mean square magnitude of said base signal.

18. The method of claim 1 wherein said time-delayed signal is provided for said subtracting step via a first feedback path and said time-delaying signal is provided for said adding in said integrator via a second feedback path.

19. The method of claim 1 wherein said first intermediate signal is said effectively-exponentiated logarithmed signal.

* * * * *